(12) United States Patent
Futatsuyama et al.

(10) Patent No.: US 8,565,020 B2
(45) Date of Patent: Oct. 22, 2013

(54) SEMICONDUCTOR MEMORY DEVICE

(75) Inventors: Takuya Futatsuyama, Yokohama (JP); Toshifumi Hashimoto, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 13/053,796

(22) Filed: Mar. 22, 2011

(65) Prior Publication Data
US 2011/0255336 A1 Oct. 20, 2011

(30) Foreign Application Priority Data

Apr. 14, 2010 (JP) ................................. 2010-093257
Apr. 28, 2010 (JP) ................................. 2010-104240

(51) Int. Cl.
G11C 16/04 (2006.01)
(52) U.S. Cl.
USPC ............. 365/185.03; 365/185.17; 365/185.22
(58) Field of Classification Search
USPC .............. 365/185.03, 185.17, 185.18, 185.22
See application file for complete search history.

(56) References Cited

U.S. PATENT DOCUMENTS

| | | | |
|---|---|---|---|
| 7,558,117 B2 | 7/2009 | Maejima et al. | |
| 7,558,118 B2 | 7/2009 | Futatsuyama | |
| 7,590,007 B2 | 9/2009 | Futatsuyama | |
| 2008/0159007 A1* | 7/2008 | Sekar et al. ............... | 365/185.27 |

FOREIGN PATENT DOCUMENTS

| | | |
|---|---|---|
| JP | 5-144277 | 6/1993 |
| JP | 2006-228394 | 8/2006 |
| JP | 2007-157315 | 6/2007 |
| JP | 2009-37720 | 2/2009 |
| JP | 2009-59460 | 3/2009 |

OTHER PUBLICATIONS

U.S. Appl. No. 12/883,520, filed Sep. 16, 2010, Yuko Namiki, et al.

* cited by examiner

*Primary Examiner* — Huan Hoang
(74) *Attorney, Agent, or Firm* — Oblon, Spivak, McClelland, Maier & Neustadt, L.L.P.

(57) ABSTRACT

A memory includes word lines, bit lines, memory cells each having a gate connected to one of the word lines, a word line driver configured to drive voltages of the word lines, and a sense amplifier configured to detect data of the memory cells via the bit lines. The memory cells are connected in series between the bit lines and a source to constitute cell string. The word line driver increases a verification voltage of any of non-selected word lines connected to non-selected memory cells in the cell string at a time of a verify operation in a certain writing loop of a writing stage. The writing stage includes a plurality of writing loops. The writing loops respectively includes a write operation to write data in a selected memory cell in the cell string and a verify operation to verify that the data are written in the selected memory cell.

20 Claims, 24 Drawing Sheets

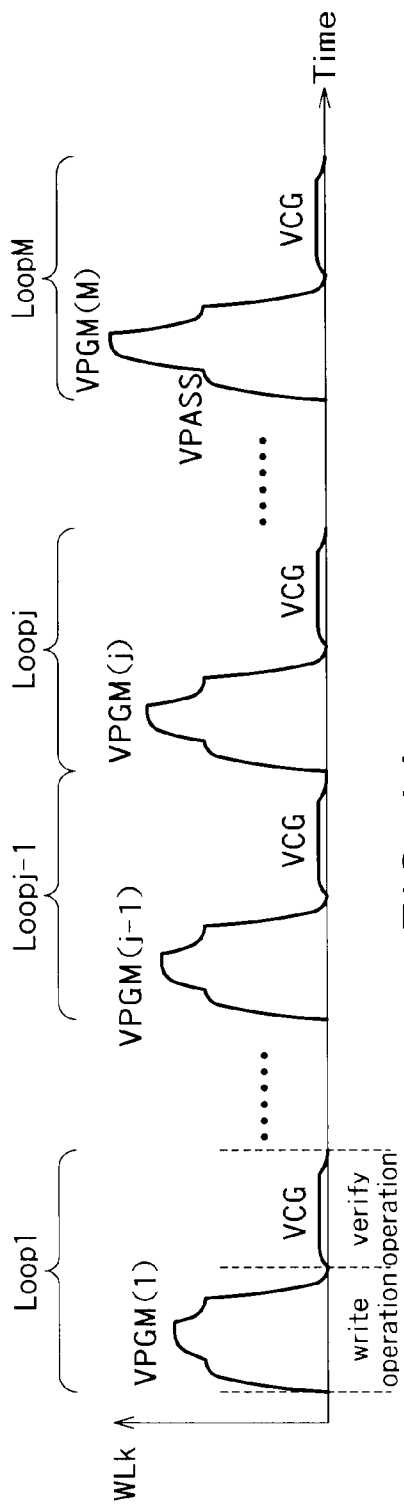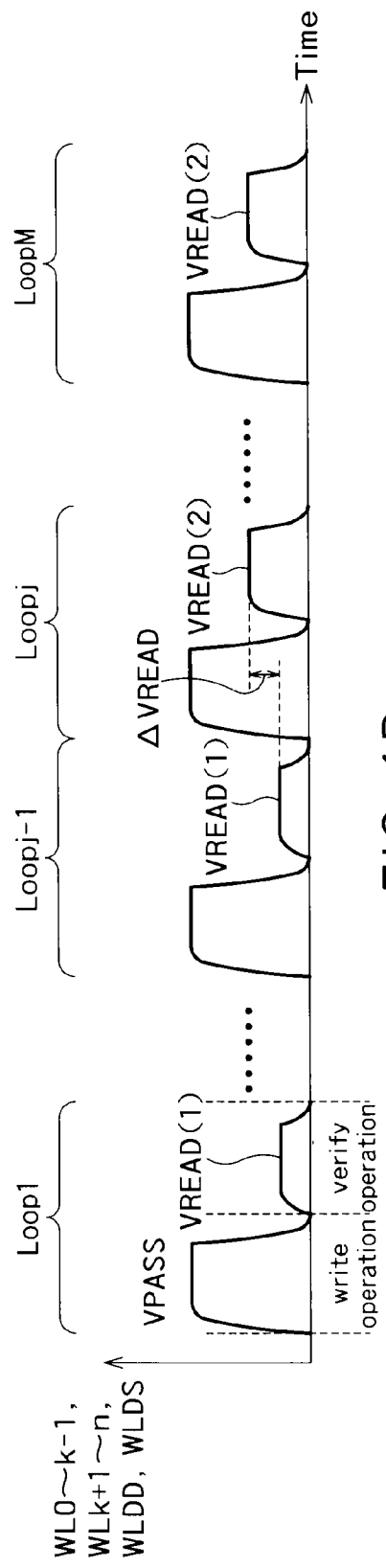

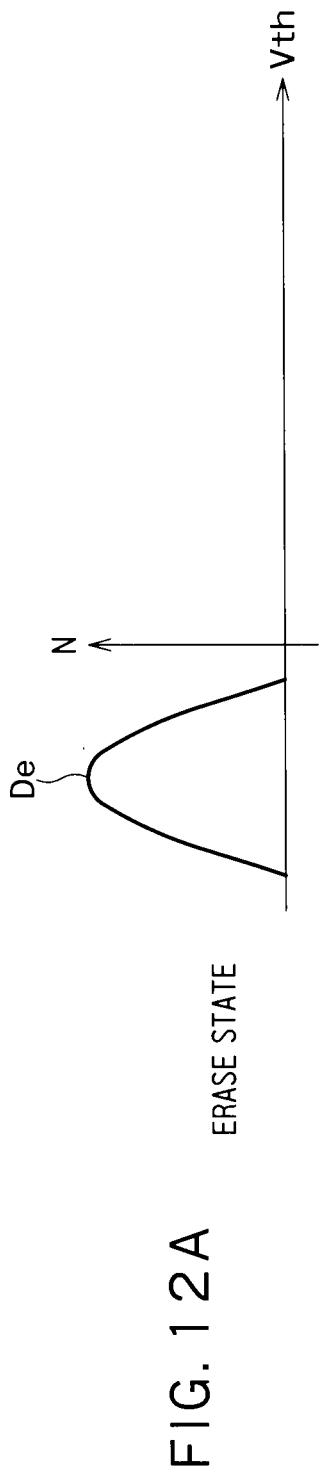
FIG. 12A  ERASE STATE
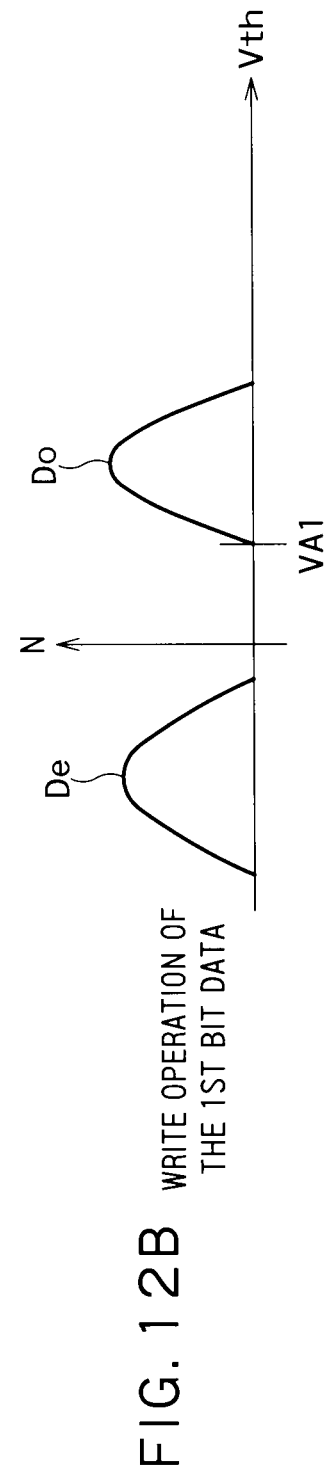
FIG. 12B  WRITE OPERATION OF THE 1ST BIT DATA
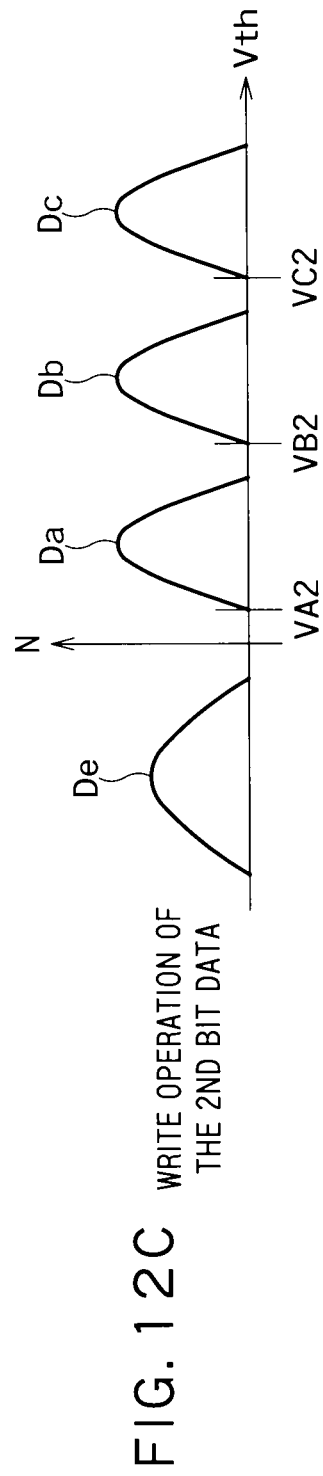
FIG. 12C  WRITE OPERATION OF THE 2ND BIT DATA

|  | 1st stage | 2nd stage |
|---|---|---|
| WLn | 2n | 2n+2 |
| WLn-1 | 2n-2 | 2n+1 |
| WLn-2 | 2n-4 | 2n-1 |
| WLn-3 | 2n-6 | 2n-3 |
| WLn-4 | 2n-8 | 2n-5 |
| ... | ... | ... |
| ... | ... | ... |
| WLk+2 | 2k+4 | 2k+7 |
| WLk+1 | 2k+2 | 2k+5 |
| WLk | 2k | 2k+3 |
| WLk-1 | 2k-2 | 2k+1 |
| WLk-2 | 2k-4 | 2k-1 |
| ... | ... | ... |
| ... | ... | ... |
| WL4 | 8 | 11 |
| WL3 | 6 | 9 |
| WL2 | 4 | 7 |
| WL1 | 2 | 5 |
| WL0 | 1 | 3 |

FIG. 18

|  | 1st stage | 2nd stage | 3rd stage |
|---|---|---|---|
| LWn | 3n−2 | 3n+1 | 3n+3 |
| LWn−1 | 3n−5 | 3n−1 | 3n+2 |
| LWn−2 | 3n−8 | 3n−4 | 3n |
| LWn−3 | 3n−11 | 3n−7 | 3n−3 |
| LWn−4 | 3n−14 | 3n−10 | 3n−6 |
| ... | ... | ... | ... |
| ... | ... | ... | ... |
| WLk+2 | 3k+4 | 3k+8 | 3k+12 |
| WLk+1 | 3k+1 | 3k+5 | 3k+9 |
| WLk | 3k−2 | 3k+2 | 3k+6 |
| WLk−1 | 3k−5 | 3k−1 | 3k+3 |
| WLk−2 | 3k−8 | 3k−4 | 3k |
| ... | ... | ... | ... |
| ... | ... | ... | ... |
| WL4 | 10 | 14 | 18 |
| WL3 | 7 | 11 | 15 |
| WL2 | 4 | 8 | 12 |
| WL1 | 2 | 5 | 9 |
| WL0 | 1 | 3 | 6 |

FIG. 21

SEMICONDUCTOR MEMORY DEVICE

CROSS REFERENCE TO RELATED APPLICATIONS

This application is based upon and claims the benefit of priority from the prior Japanese Patent Applications No. 2010-93257, filed on Apr. 14, 2010, and No. 2010-104240, filed on Apr. 28, 2010, the entire contents of which are incorporated herein by reference.

FIELD

The embodiments of the present invention relate to a semiconductor memory device.

BACKGROUND

Nonvolatile semiconductor memory devices such as a NAND flash memory are increasingly downscaled in order to expand memory capacities. With increased downscaling, distances between adjacent memory cells are shortened, which causes considerable interference and the like (hereinafter, "proximity effect") between the memory cells. The proximity effect adversely increases a width of a threshold voltage distribution of the memory cells in which data are written.

Meanwhile, as the memory is downscaled, it is preferable that voltages to be applied during writing and reading are lowered. However, when the width of the threshold voltage distribution of the memory cells is increased, distances between data (voltage differences) need to be increased and the voltages applied during writing and reading become rather higher. Therefore, differences between threshold voltages of the memory cells after data writing and threshold voltages of the memory cells after data erasing become larger. As a result, the interference (proximity effect) between the adjacent memory cells is increased and the width of the threshold voltage distribution is further increased.

Even when the width of the threshold voltage distribution becomes larger, increases in writing or reading voltages can be suppressed by using an ECC (Error Correcting Code). However, the ECC with a high correcting capability requires many redundant columns, which increases the number of gates in an ECC circuit. This leads to an increase in a chip size of the memory and costs thereof.

A multi-level storage memory in which each memory cell stores therein two or more bits of data achieve one data writing in two or more stages to reduce the proximity effect. In this case, a writing stage is sometimes performed for memory cells MCn−1 and MCn+1 adjacent to the memory cell MCn between first and second writing stages for a memory cell MCn connected to a word line WLn. Accordingly, threshold voltages of the memory cells MCn−1 and MCn+1 in the second writing stage for the memory cell MCn become higher than threshold voltages of the memory cells MCn−1 and MCn+1 in the first writing stage for the memory cell MCn in some cases. In these cases, resistances of the memory cells MCn−1 and MCn+1 during verify reading of the second writing stage for the memory MCn are higher than those during verify reading of the first writing stage. Accordingly, currents (cell currents) flowing through the selected memory cells MCn are varied due to influences of the adjacent memory cells MCn−1 and MCn+1. This is also a factor that increases the width of the threshold voltage distribution.

BRIEF DESCRIPTION OF THE DRAWINGS

FIGS. 4A and 4B are graphs showing transitions of voltages of the word lines in a writing stage according to the first embodiment;

FIGS. 12A to 12C are graphs representing a data write operation according to a fifth embodiment of the present invention by transitions of threshold voltage distributions of memory cells;

FIG. 18 is a table showing an order in which the first and second writing stages are performed on the memory cells connected to the respective word lines;

FIG. 21 is a table showing an order in which the first to third writing stages are performed on the memory cells connected to the respective word lines;

DETAILED DESCRIPTION

A semiconductor memory device according to an embodiment includes a plurality of word lines, a plurality of bit lines, a plurality of memory cells each having a gate connected to one of the word lines, a word line driver configured to drive voltages of the word lines, and a sense amplifier configured to detect data of the memory cells via the bit lines. The memory cells are connected in series between the bit lines and a source to constitute cell string. The word line driver increases a verification voltage of any of non-selected word lines connected to non-selected memory cells in the cell string at a time of a verify operation in a certain writing loop of a writing stage. The writing stage includes a plurality of writing loops. The writing loops respectively includes a write operation to write data in a selected memory cell in the cell string and a verify operation to verify that the data are written in the selected memory cell.

Further, in a semiconductor memory device according to another embodiment, multiple bits of data is stored in a selected memory cell by performing a first writing stage and a second writing stage. The first writing stage brings the selected memory cell into a first state by repeating a writing loop including a write operation and a verify read operation. The write operation is an operation in which data is written in the selected memory cell in the cell string. The verify read operation is an operation in which it is verified that the data is written in the selected memory cell. The second writing stage brings the selected memory cell from the first state into a second state by repeating the writing loop. The word line driver increases a verification voltage of any of non-selected word lines connected to non-selected memory cells in the cell string during the verify read operation when the second writing stage is performed on the selected memory cell. The increased verification voltage is greater than the verification voltage when the first writing stage is performed on the selected memory cell.

Embodiments will now be explained with reference to the accompanying drawings.

(First Embodiment)

Figure 1:
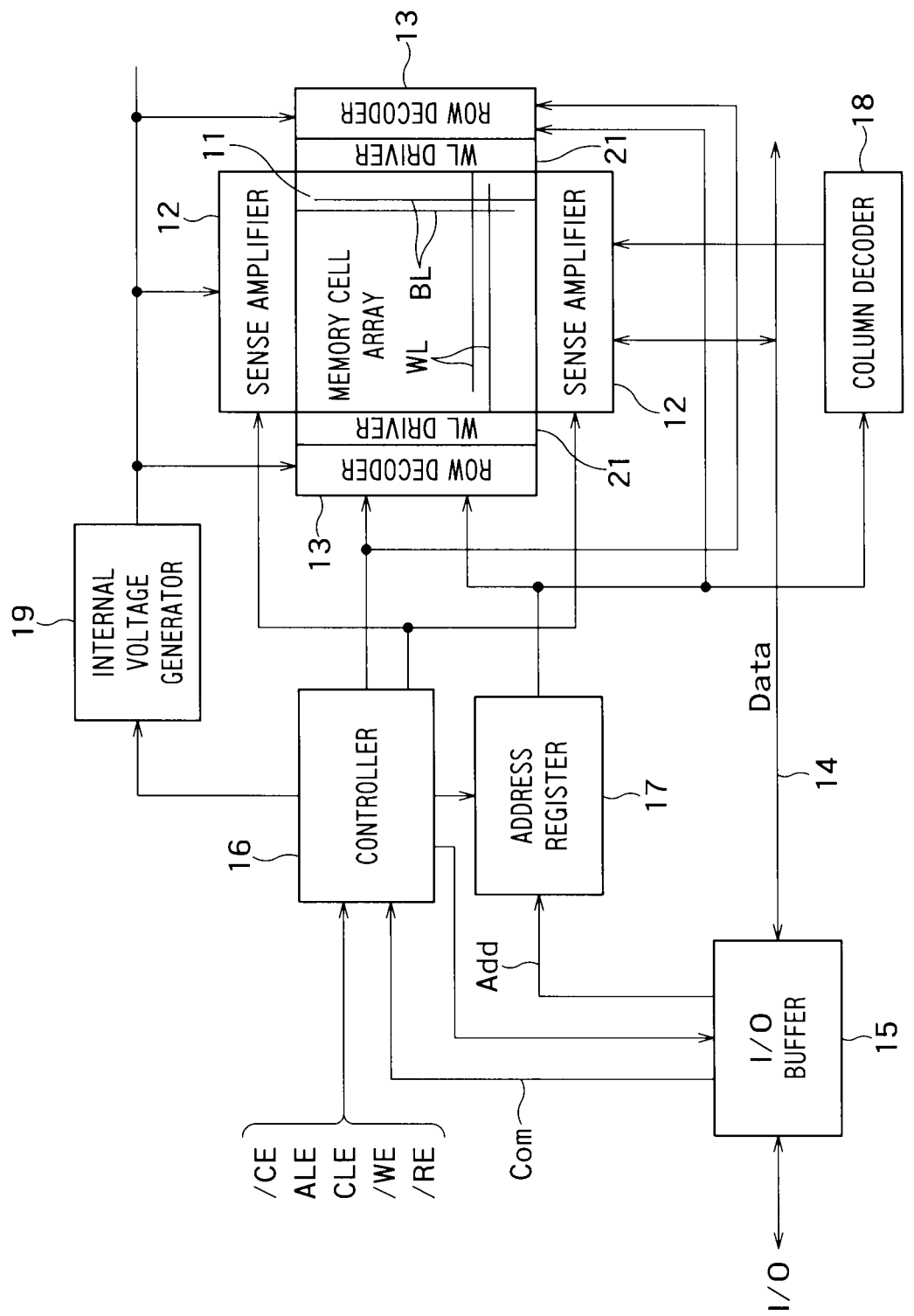
FIG. 1 is a block diagram showing a configuration of a NAND flash memory according to a first embodiment of the present invention.

FIG. 1 is a block diagram showing a configuration of a NAND flash memory according to a first embodiment. A memory cell array 11 includes a plurality of memory cells arranged two-dimensionally in a matrix. Gates of the memory cells are connected to word lines. Sources or drains of the memory cells are connected to bit lines. The word lines are extended in a row direction and the bit lines are extended in a column direction in such a manner that they intersect with each other. A sense amplifier 12 is placed on one end of the memory cell array 11 in the bit line direction. Another sense amplifier 12 is placed also on the other end opposite to the end of the memory cell array 11 in the bit line direction. The sense amplifiers 12 are connected to the bit lines and detect voltages of the bit lines or cell currents flowing through memory cells connected to a selected word line via the bit lines, thereby detecting data stored in the memory cells. A row decoder 13 and a word line driver 21 are placed on either end of the memory cell array 11 in the word line direction. The word line driver 21 is connected to the word lines and configured to apply voltages to the word lines when data are to be written in the memory cells.

In the NAND flash memory, a plurality of memory cells are connected in series to configure a NAND string. One end of the NAND string is connected to a bit line BL via a selection transistor and the other end is connected to a source S via a selection transistor. Therefore, a memory cell is connected to the bit line BL via other memory cells located between the memory cell and the bit line BL. Distances between adjacent memory cells in the NAND string are 30 nanometers (nm) or less, for example.

Data exchange between the sense amplifier 12 and an external input/output terminal I/O is performed via a data bus 14 and an I/O buffer 15.

Various external control signals such as a chip enable signal/CE, an address latch enable signal ALE, a command latch enable signal CLE, a write enable signal/WE, and a read enable signal/RE are inputted to a controller 16. The controller 16 identifies an address Add and a command Com supplied through the input/output terminal I/O based on the control signals. The controller 16 causes an address register 17 to transfer the address Add to the row decoders 13 and a column decoder 18. The controller 16 decodes the command Com. The sense amplifiers 12 are configured to apply a voltage to a bit line according to a column address decoded by the column decoder 18. The word line drivers 21 are configured to apply a voltage to a word line according to a row address decoded by the row decoder 13.

The controller 16 performs sequence control of data reading, data writing, or erasing according to the external control signals and the command. An internal-voltage generating circuit 19 is provided to generate an internal voltage required for each operation (a voltage obtained by stepping up a supply voltage, for example). The internal-voltage generating circuit 19 is also controlled by the controller 16 and performs a stepping-up operation to generate a required voltage.

Figure 2A:
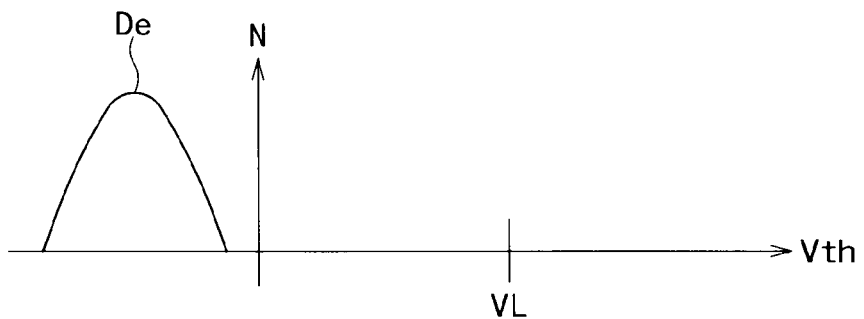
FIGS. 2A to 2D are graphs representing a typical data write operation by transitions of threshold voltage distributions of memory cells as a comparison example.

FIGS. 2A to 2D are graphs representing a typical data write operation (a program operation) by transitions of threshold voltage distributions of memory cells as a comparison example. The horizontal axes of the graphs show the threshold voltages of memory cells. The vertical axes of the graphs show the numbers of memory cells. FIG. 2A shows a distribution De in an erasure state where all memory cells are in an erased state. FIGS. 2A to 2D show a writing stage in which data are written in selected memory cells of respective columns connected to a selected word line.

Figure 3:
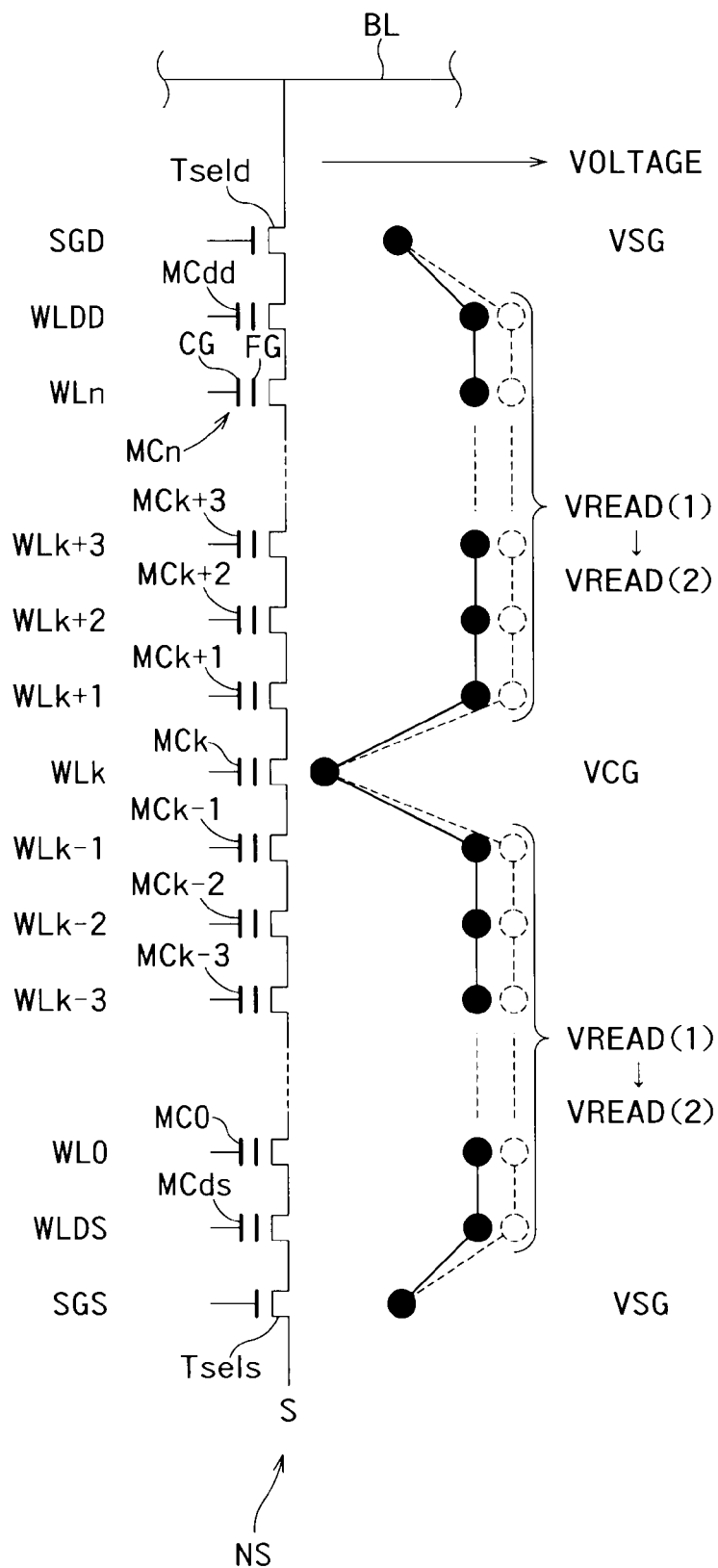
FIG. 3 is a conceptual diagram showing verify read voltages to be applied to word lines WL0 to WLn, WLDS, and WLDD of a NAND string NS, and gates SGS and SGD of the selection transistors Tsels and Tseld in the NAND flash memory according to the first embodiment.

The memory cells MC of the NAND flash memory each include a floating gate FG and a control gate CG as shown in FIG. 3. The control gates CG are connected to word lines WL, and the word line driver 21 applies voltages to the control gates CG via the word lines WL. With this configuration, the threshold voltages of the memory cells MC are varied by injecting charges (electrons, for example) in the floating gates FG or extracting charges from the floating gates FG. For example, assuming that all the memory cells MC include an N-type FET (Field-Effect Transistor), the threshold voltages are increased by the injected charges in the floating gates FG.

In contrast, the threshold voltages are decreased by extracting charges from the floating gates FG. Here, a state where the threshold voltages of the memory cells MC are high is referred to as data "0" and a state where the threshold voltages of the memory cells MC are low is referred to as data "1". That is, the erasure state shown in FIG. 2A indicates the data "1" and FIGS. 2A to 2D show an operation to write the data "0" in any of the memory cells MC that store therein the data "1" (hereinafter, also "1" cells).

The NAND flash memory writes data in the memory cells MC by repeating a plurality of times a writing loop including a write operation to write data in selected memory cells and a verify operation to verify that the data are written in the selected memory cells. For example, it can be said that FIGS. 2A to 2D show threshold voltage distributions representing results of performance of the writing loops, respectively. Hereinafter, a writing sequence including the plural writing loops is referred to as "writing stage".

Selected memory cells that have attained predetermined threshold voltages in one writing and verify operation are disconnected from the bit lines by selection transistors Tseld and Tsels (see FIG. 3) in a next write operation and no writing is performed therefor. Writing is performed also in the next write operation to selected memory cells that have not attained the predetermined threshold voltages in the verify operation.

Figure 2B:
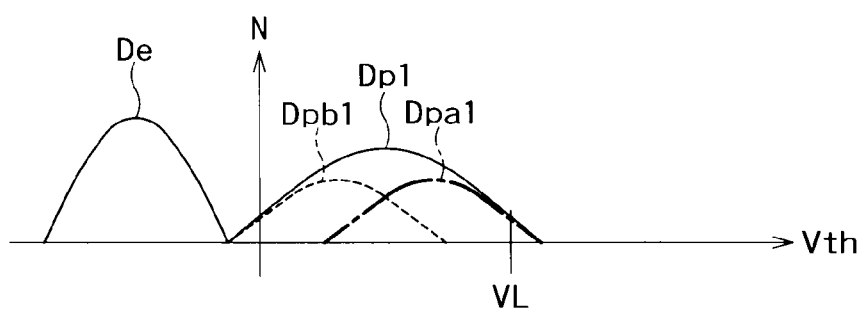

FIG. 2B shows threshold voltage distributions of the memory cells after a first writing loop is performed. Dp1 denotes a threshold voltage distribution of all memory cells that have been subject to writing. A distribution Dpa1 indicates memory cells having relatively high threshold voltages, that is, memory cells having relatively high writing speeds among the memory cells of the distribution Dp1. A distribution Dpb1 indicates memory cells having relatively low threshold voltages, that is, memory cells having relatively low writing speeds among the memory cells of the distribution Dp1.

A verify operation is performed after each write operation. VL denotes a verify level. When a threshold voltage of a selected memory cell attains the verify level VL, it is considered that data is written in the selected memory cell. That is, the selected memory cell is determined to have passed verification. Therefore, subsequent writing in the writing stage is not performed on the selected memory cell.

On the other hand, when the threshold voltage of the selected memory cell is lower than the verify level VL, it is considered that data have not been written in the selected memory cell. That is, the selected memory cell is determined to have failed verification. Therefore, writing is further performed on the selected memory cell in the next writing loop.

Figure 2C:
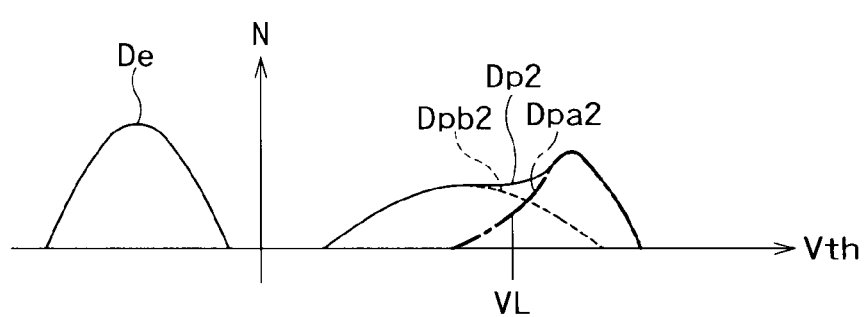

FIG. 2C shows threshold voltage distributions of memory cells after a second writing loop is performed. Dp2 denotes a threshold voltage distribution of all the memory cells that have been subject to second writing. A distribution Dpa2 indicates memory cells having relatively high threshold voltages, that is, memory cells having relatively high writing speeds among the memory cells of the distribution Dp2. A distribution Dpb2 indicates memory cells having relatively low threshold voltages, that is, memory cells having relatively low writing speeds among the memory cells of the distribution Dp2. Generally, the memory cells belonging to the distribution Dpa1 are moved to the distribution Dpa2 by the second writing and the memory cells belonging to the distribution Dpb1 are moved to the distribution Dpb2 by the second writing.

At the time of the second writing, threshold voltages of most of the memory cells with higher writing speeds belonging to the distribution Dpa2 attain the verify level VL. Threshold voltages of most of the memory cells with lower writing speeds belonging to the distribution Dpb2 do not attain the verify level VL yet. It is considered that writing to the memory cells that have attained the verify level VL is completed and these memory cells do not become targets for the next writing loop. Hereinafter, selected memory cells in columns to which the writing is completed are referred to as "writing complete memory cells" and selected memory cells in columns to which the writing is not completed as "writing incomplete memory cells".

Because the NAND strings including the writing complete memory cells are disconnected from the bit lines BL and the source S, body areas (channel portions) of the writing complete memory cells are brought into an electrically floating state.

Figure 2D:
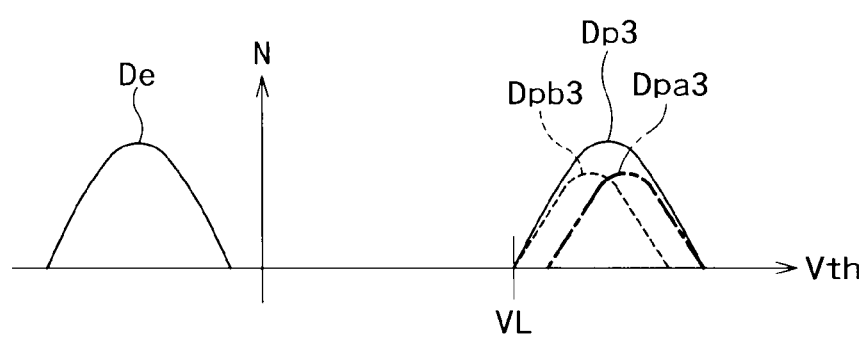

FIG. 2D shows threshold voltage distributions of the memory cells after a third writing loop is performed. A distribution Dp3 represents a threshold voltage distribution of all the memory cells that have been subject to third writing. A distribution Dpa3 represents memory cells having relatively high threshold voltages, that is, memory cells having relatively high writing speeds among the memory cells of the distribution Dp3. A distribution Dpb3 represents memory cells having relatively low threshold voltages, that is, relatively low writing speeds among the memory cells of the distribution Dp3. Generally, the memory cells belonging to the distribution Dpa2 in FIG. 2C are moved to the distribution Dpa3 by the third writing and the memory cells belonging to the distribution Dpb2 are moved to the distribution Dpb3 by the third writing.

NAND strings including the writing complete memory cells share the word lines WL with NAND strings including the writing incomplete memory cells. Accordingly, gate voltages are applied to gates of the writing complete memory cells even after completion of the writing. At this time, potentials of the body areas of the writing complete memory cells are stepped up according to the gate voltages due to capacitive coupling with the control gates CG and writing is hardly performed therefor. However, the potentials of the body areas do not transit to voltages equal to the gate voltages and therefore certain electric fields are applied to the floating gates FG. These electric fields cause few charges to be quantum-injected into the writing complete memory cells. That is, while subsequent writing to the writing complete memory cells belonging to the distribution Dpa2 in FIG. 2C is prohibited, threshold voltages of the writing complete memory cells are slightly increased by writing loops after the writing completion as shown by the distribution Dpa3 in FIG. 2D.

Therefore, the distribution Dpa3 with relatively high threshold voltages out of the threshold voltage distribution Dp3 shown in FIG. 2D is composed of the memory cells that have higher writing speeds and to which writing has been completed in a few writing loops. The distribution Dpb3 with relatively low threshold voltages is composed of the memory cells that have lower writing speeds and to which writing has been completed in many writing loops.

As described above, because the threshold voltages of the writing complete memory cells are gradually increased by the writing loops after the writing completion, the threshold voltage distribution Dp3 is broadened at an end of the writing stage when writing to all the memory cells has been completed.

Therefore, in the NAND flash memory according to the first embodiment, the word line driver 21 raises a verify read voltage VREAD to be used for verification of any of the word lines connected to non-selected memory cells in the NAND strings at a certain point of time in a writing stage.

FIG. 3 is a conceptual diagram showing verify read voltages to be applied to word lines WL0 to WLn, WLDS, and WLDD of a NAND string NS, and gates SGS and SGD of the selection transistors Tsels and Tseld in the NAND flash memory according to the first embodiment. Here, "n" is an integer. As shown in FIG. 3, the NAND string NS as a cell string includes a plurality of memory cells MC connected in series between a bit line BL and a source S. One end of the NAND string NS is connected to the bit line BL via the selection transistor Tseld and the other end thereof is connected to the source S via the selection transistor Tsels.

Each of the memory cells MC includes a source layer, a drain layer, a floating gate FG, and a control gate CG. Two adjacent memory cells MC in the NAND string NS share the source or drain layer. This causes the memory cells MC to be connected in series in the NAND string NS.

In FIG. 3, a word line WLk ($0 \leq k \leq n$) functions as a selected word line. The word lines WL0 to WLk−1 and WLk+1 to WLn function as non-selected word lines when $1 \leq k \leq n-1$, the word lines WL1 to WLn function as non-selected word lines when k=0, and the word lines WL0 to WLn−1 function as non-selected word lines when k=n. The word line driver 21 applies the same voltage also to the word lines WLDS and WLDD nearest to the selection transistors Tsels and Tseld as that applied to the other non-selected word lines WL0 to WLk−1 and WLk+1 to WLn. Here, memory cells connected to the word lines WL0 to WLn are denoted by MC0 to MCn, respectively, and memory cells connected to the word lines WLDS and WLDD are denoted by MCds and MCdd, respectively. The word lines WLDS and WLDD are dummy word lines and the cells MCds and MCdd are dummy cells not used for data storage. While the NAND string including the dummy word lines WLDS and WLDD is used as an example in the first embodiment, this embodiment can be also applied to a NAND string including no dummy word lines.

In this case, effects identical to those of the first embodiment can be obtained.

After writing data in each writing loop, the memory performs a verify operation. In the verify operation, the word line driver 21 applies the verify read voltage VREAD to the non-selected word lines WL0 to WLk−1, WLk+1 to WLn, WLDS, and WLDD. The word line driver 21 applies a gate voltage VCG lower than VREAD to the selected word line WLk. The word line driver 21 sets gate voltages of the selection transistors Tsels and Tseld to VSG. The gate voltage VSG is lower than the verify read voltage VREAD and brings the selection transistors Tsels and Tseld into a conduction state. This causes the non-selected memory cells MC0 to MCk−1, MCk+1 to MCn, MCds, and MCdd to be in a conduction state and the selection transistors Tsels and Tseld to be in a conduction state. As a result, the selected memory cell MCk is brought into a state connected between the bit line BL and the source S. A sense amplifier S/A can detect data in the selected memory cell MCk by applying a voltage to the selected memory cell MCk via the bit line BL.

FIGS. 4A and 4B are graphs showing transitions of voltages of the word lines in a writing stage according to the first embodiment. FIG. 4A shows voltages of the selected word line WLk. FIG. 4B shows voltages of the non-selected word lines WL0 to WLk−1, WLk+1 to WLn, WLDD, and WLDS.

An operation for the selected word line WLk shown in FIG. 4A is explained first. The word line driver 21 steps up program voltages VPGM(1) to VPGM(M) of the selected word line WLk in writing loops Loop1 to LoopM, respectively, during write operations. With this configuration, the program voltages become higher with an increase in the number of writing loops. That is, even to memory cells not having passed verification in early writing loops of the writing stage, data (charges) can be sufficiently written in subsequent writing loops by stepping up the program voltages, which enables the memory cells to pass the verification.

A voltage applied to the selected word line WLk in verify operations of the writing loops Loop1 to LoopM is VCG and constant. That is, the gate voltage VCG of the selected memory cell MCk in the verify operations is constant in the writing loops Loop1 to LoopM.

Meanwhile, voltages of the non-selected word lines WL0 to WLk−1, WLk+1 to WLn, WLDD, and WLDS shown in FIG. 4B are VPASS and constant in the write operations of the writing loops Loop1 to LoopM. However, voltages of the non-selected word lines WL0 to Wlk−1, WLk+1 to WLn, WLDD, and WLDS in the verify operations of the writing loops Loop1 to LoopM are VREAD(1) or VREAD(2). VREAD(1) is lower than VREAD(2). In early writing loops of the writing stage, the word line driver 21 applies the relatively low verify read voltage VREAD(1) to the non-selected word lines WL0 to WLk−1, WLk+1 to WLn, WLDD, and WLDS. At a certain point of time in the writing stage, the word line driver 21 applies the relatively high verify read voltage VREAD(2) to the non-selected word lines WL0 to WLk−1, WLk+1 to WLn, WLDD, and WLDS.

Figure 5A:
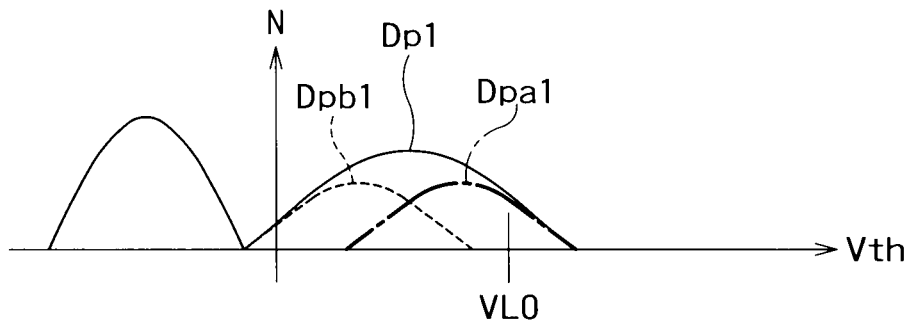
FIGS. 5A to 5C are graphs representing a data write operation according to the first embodiment by transitions of threshold voltage distributions of memory cells.
Figure 5B:
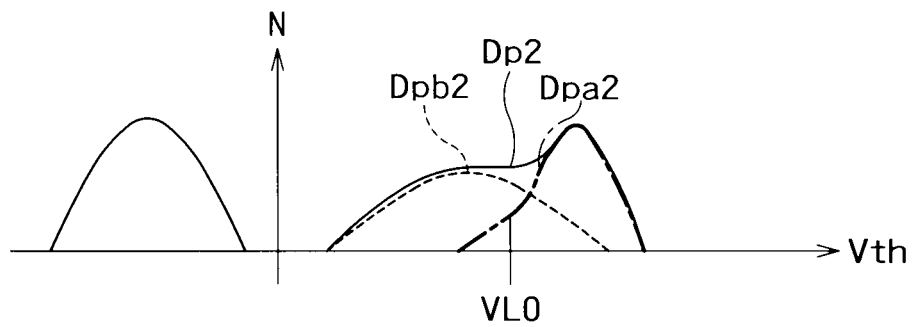
Figure 5C:
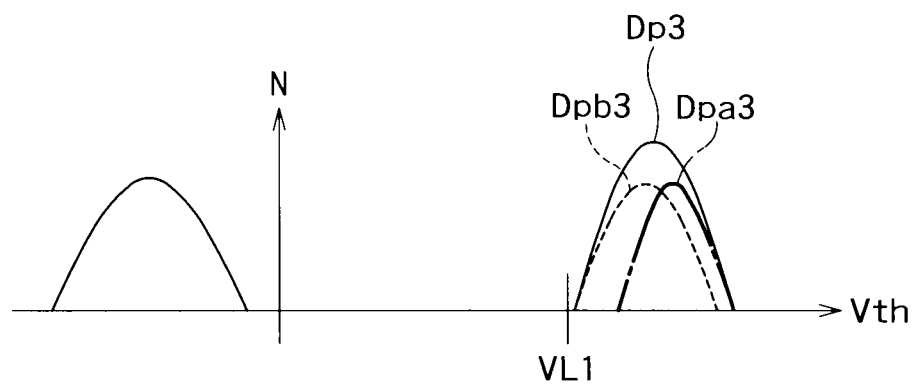

The reason why the verify read voltage to be applied to the non-selected word lines is changed in this way is explained below with referring to FIGS. 5A to 5C. FIGS. 5A to 5C are graphs representing a data write operation (a program operation) according to the first embodiment by transitions of threshold voltage distributions of memory cells. Because a threshold voltage distribution in an erasure state is the same as that shown in FIG. 2A, explanations thereof will be omitted.

When the verify read voltage is constant in respective writing loops like in the conventional case, the threshold voltages of the writing complete memory cells are gradually increased with the writing loops after the writing completion and the threshold voltage distribution Dp3 is broadened at the end of the writing stage, as is explained with referring to FIGS. 2C and 2D.

On the other hand, the memory according to the first embodiment uses the lower verify read voltage VREAD(1) for the non-selected word lines at the beginning of the writing stage. While the non-selected memory cells MC0 to MCk−1, MCk+1 to MCn, MCDD, and MCDS are brought into a conduction state by application of the verify read voltage VREAD(1) to the gates, ON resistances thereof are higher than ON resistances thereof when VREAD(2) is applied thereto. Accordingly, a resistance between the bit line BL and the source S become apparently higher. That is, a resistance of the selected memory cell MCk is higher when seen from the sense amplifiers 12. In other words, the verify level VL becomes apparently lower. As a result, the selected memory cell becomes easier to pass the verify operation. The apparent verify level at this time is denoted by VL0 in FIG. 5A.

Selected memory cells with higher writing speeds belonging to a distribution Dpai (i=1 to 3) shown in FIGS. 5A to 5C pass verification in a small number of writings. As shown in FIG. 5B, while some of selected memory cells with lower writing speeds belonging to a distribution Dpbi also pass verification in a small number of writings, most of the selected memory cells belonging to the distribution Dpbi have not passed the verification yet.

The word line driver 21 raises the verify read voltage to the relatively high VREAD(2) at a certain point of time in the writing stage. This decreases the ON resistances of the non-selected memory cells MC0 to MCk−1, MCk+1 to MCn, MCDD, and MCDS. Accordingly, the resistance between the bit line BL and the source S become apparently lower. That is, the resistance of the selected memory cell MCk is relatively low when seen from the sense amplifiers 12. In other words, the verify level becomes apparently higher. As a result, the selected memory cell becomes harder to pass the verify operation. The apparent verify level at this time is denoted by VL1 in FIG. 5C.

As shown in FIG. 5B, many of the selected memory cells with higher writing speeds belonging to the distribution Dpa2 pass verification in the writing loop using the verify read voltage VREAD(1). These memory cells with higher writing speeds pass the verification with the apparently lower verify level VL0. Therefore, the distribution Dpa2 shown in FIG. 5B is shifted toward a side of lower threshold voltages as compared to the distribution Dpa2 shown in FIG. 2C as the comparison example. Also when the apparent verify level is changed in this way, writing to the selected memory cells that have once passed the verification is prohibited in subsequent writing loops. Even when the writing is prohibited, the threshold voltages of the selected memory cells to which the writing is completed are slightly raised by driving of the word line WLk in the subsequent writing loops as described above. That is, in the first embodiment, the raises in the threshold voltages of the selected memory cells with higher writing speeds having passed the verification after the writing completion can be substantially cancelled, because the threshold voltages of the selected memory cells with higher writing speeds are originally shifted toward the lower voltage side. It is preferable that a difference between the verify read voltages VL0 and VL1 is substantially equal to an amount of shift in the threshold voltage by the writing loops after the writing completion in order to cancel the raises in the threshold voltages after the writing completion.

Further, when the verify read voltage is stepped up to VREAD(2) at the certain point of time in the writing stage, selected memory cells with lower writing speeds belonging to the distribution Dpb3 are subject to verification in writing loops using the verify read voltage VREAD(2) as shown in FIG. 5C. These selected memory cells with lower writing speeds pass the verification when they exceed the apparently higher verify level VL1. As a result, an overlapped area between the threshold voltage distribution Dpb3 of the selected memory cells with lower writing speeds and the threshold voltage distribution Dpa3 of the selected memory cells with higher writing speeds is increased, and a width of the entire threshold voltage distribution Dp3 is narrowed.

As described above, the NAND flash memory according to the first embodiment can narrow the threshold voltage distribution of the memory cells after writing by setting the verify level in the early writing loops of the writing stage to an apparently lower value and then raising the verify level in an intermediate writing loop of the writing stage. The first embodiment enables to suppress increases in the writing voltages or reading voltages without changing the correcting capability of the ECC by narrowing the threshold voltage distribution of the memory cells after writing. Therefore, the first embodiment enables to suppress an increase in the chip size.

The number of memory cells MC included in each NAND string NS has been increased with the recent downscaling of the memory cells and the expansion of the memory capacities. In this situation, the ON resistance of the entire NAND string NS can be more greatly varied by the verify read voltage VREAD applied to the many non-selected memory cells MC0 to MCk−1, MCk+1 to MCn, MCDD, and MCDS than by the verify read voltage VCG applied to the single selected memory cell MCk. Therefore, the width of the threshold voltage distribution Dp3 can be efficiently narrowed by changing the verify read voltage VREAD at some point of the writing stage.

A voltage difference ΔVREAD between VREAD(1) and VREAD(2) depends on distances between gates of adjacent memory cells MC. For example, a voltage difference ΔVREAD is preferably 0.4 to 0.6 V (volt) in a generation in which distances between adjacent gates are about 30 nm. A voltage difference ΔVREAD is preferably 0.3 to 0.4 V in a generation in which distances between adjacent gates are about 25 nm. A voltage difference ΔVREAD is preferably 0.2 to 0.3 V in a generation in which distances between adjacent gates are about 20 nm.

A writing loop Loopj (1≤j≤M) in which the verify read voltage VREAD is changed is preferably a middle writing loop of all the writing loops. That is, j is preferably an integer around M/2. However, when data writing stages and erasures are repeated for the memory cells, charges occur to be trapped in a tunnel dielectric film between the floating gates FG and the body areas and the number of writing loops in the writing stages tends to decrease. In considering the charge trap, the writing loop Loopj in which the verify read voltage VREAD is changed is preferably a writing loop slightly before the middle of all the writing loops. That is, j is preferably an integer smaller than M/2.

Further, in the first embodiment, the word line driver 21 steps up the verify read voltage VREAD only once during the writing stage. However, the number of changes of the verify read voltage VREAD in each writing stage is not limited to one. The word line driver 21 can increase the verify read voltage VREAD twice or more times during the writing stage. For example, the word line driver 21 can increase the verify read voltage VREAD in each of the writing loops Loop1 to LoopM. In this case, while the verify read voltage VREAD needs to be set finely in multi levels, the width of the threshold voltage distribution Dp3 can be narrowed more efficiently and variations in the threshold voltages can be suppressed more. Step-up widths of the verify read voltage VREAD are preferably the same in the respective writing loops. For example, assuming that the verify read voltage is raised by ΔVREAD during a certain writing stage, a step-up width of the verify read voltage VREAD in each of the writing loops Loop1 to LoopM can be set to ΔVREAD/(M−1).

(Second Embodiment)

Figure 6:
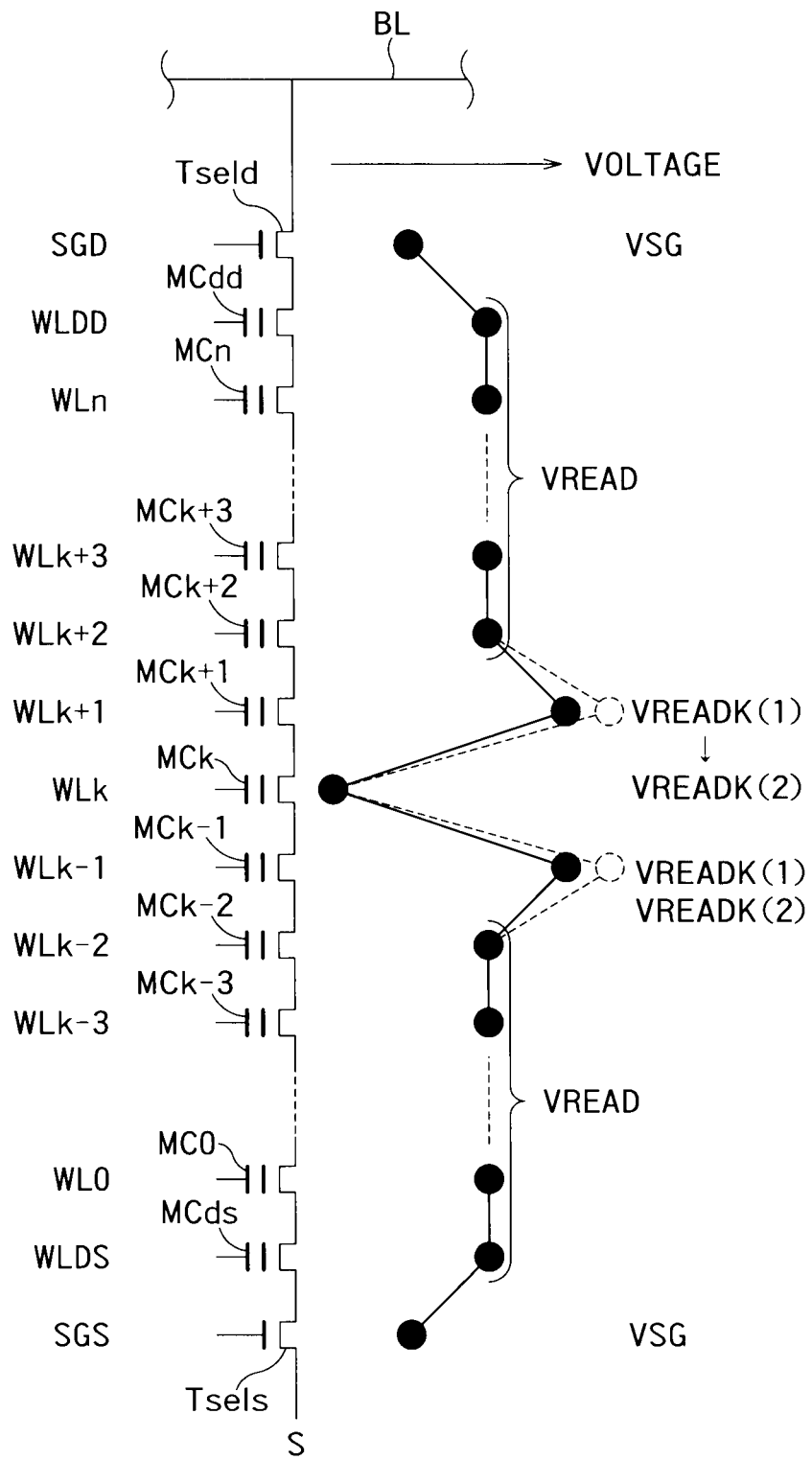
FIG. 6 is a conceptual diagram showing verify read voltages to be applied to word lines WL0 to WLn, WLDS, and WLDD, and gates SGS and SGD of selection transistors Tsels and Tseld in a NAND string NS of a NAND flash memory according to a second embodiment.

FIG. 6 is a conceptual diagram showing verify read voltages to be applied to word lines WL0 to WLn, WLDS, and WLDD, and gates SGS and SGD of selection transistors Tsels and Tseld in a NAND string NS of a NAND flash memory according to a second embodiment.

In the first embodiment, the word line driver 21 applies the same verify read voltage VREAD to the non-selected word lines WL0 to WLk−1, WLk+1 to WLn, WLDS, and WLDD other than the selected word line WLk. In contrast, according to the second embodiment, the word line driver 21 applies to the non-selected word lines WLk−1 and WLk+1 adjacent to the selected word line WLk on both sides in the NAND string NS, a verify read voltage VREADK different from the verify read voltage VREAD to be applied to the other non-selected word lines WL0 to WLk−2 and WLk+2 to WLn.

When the distances between adjacent memory cells are smaller, the proximity effect becomes larger. In a verify read operation, memory cells MCk−1 and MCk+1 that are connected to the word lines WLk−1 and WLk+1 adjacent to the selected word line WLk need to be brought into a conduction state.

However, when the distances between adjacent memory cells become smaller, capacitance between word lines or capacitance between a word line and a floating gate FG corresponding to a word line adjacent to the word line is increased (hereinafter, this phenomenon is also referred to as "proximity effect"). Therefore, floating gates FG of the memory cells MCk−1 and MCk+1 are easily affected by the voltage of the selected word line WLk due to the proximity effect. Accordingly, voltages of the floating gates FG of the non-selected memory cells MCk−1 and MCk+1 are harder to increase than voltages of floating gates FG of the other non-selected memory cells MC0 to MCk−2 and MCk+2 to MCn. That is, threshold voltages of the non-selected memory cells MCk−1 and MCk+1 become apparently higher than threshold voltages of the other non-selected memory cells MC0 to MCk−2 and MCk+2 to MCn, which makes the non-selected memory cells MCk−1 and MCk+1 harder to be brought into a conduction state.

Accordingly, the verify read voltage VREADK for the word lines WLk−1 and WLk+1 adjacent to the selected word line WLk is set higher than the verify read voltage VREAD for the other non-selected word lines WL0 to WLk−2 and WLk+2 to WLn. This enables to cancel influences of the voltage VCG of the selected word line WLk exerted on the word lines WLk−1 and WLk+1 as much as possible.

Furthermore, in the second embodiment, the word line driver 21 raises only the verify read voltage VREADK for the non-selected word lines WLk−1 and WLk+1 adjacent to the selected word line WLk on the both sides during the writing stage. The word line driver 21 keeps the verify read voltage VREAD for the non-selected word lines WL0 to WLk−2, WLk+2 to WLn, WLDD, and WLDS other than the non-selected word lines WLk−1 and WLk+1 constant. Other operations in the second embodiment can be the same as corresponding operations in the first embodiment. The configuration of the second embodiment can be identical to that of the first embodiment.

Figure 7:
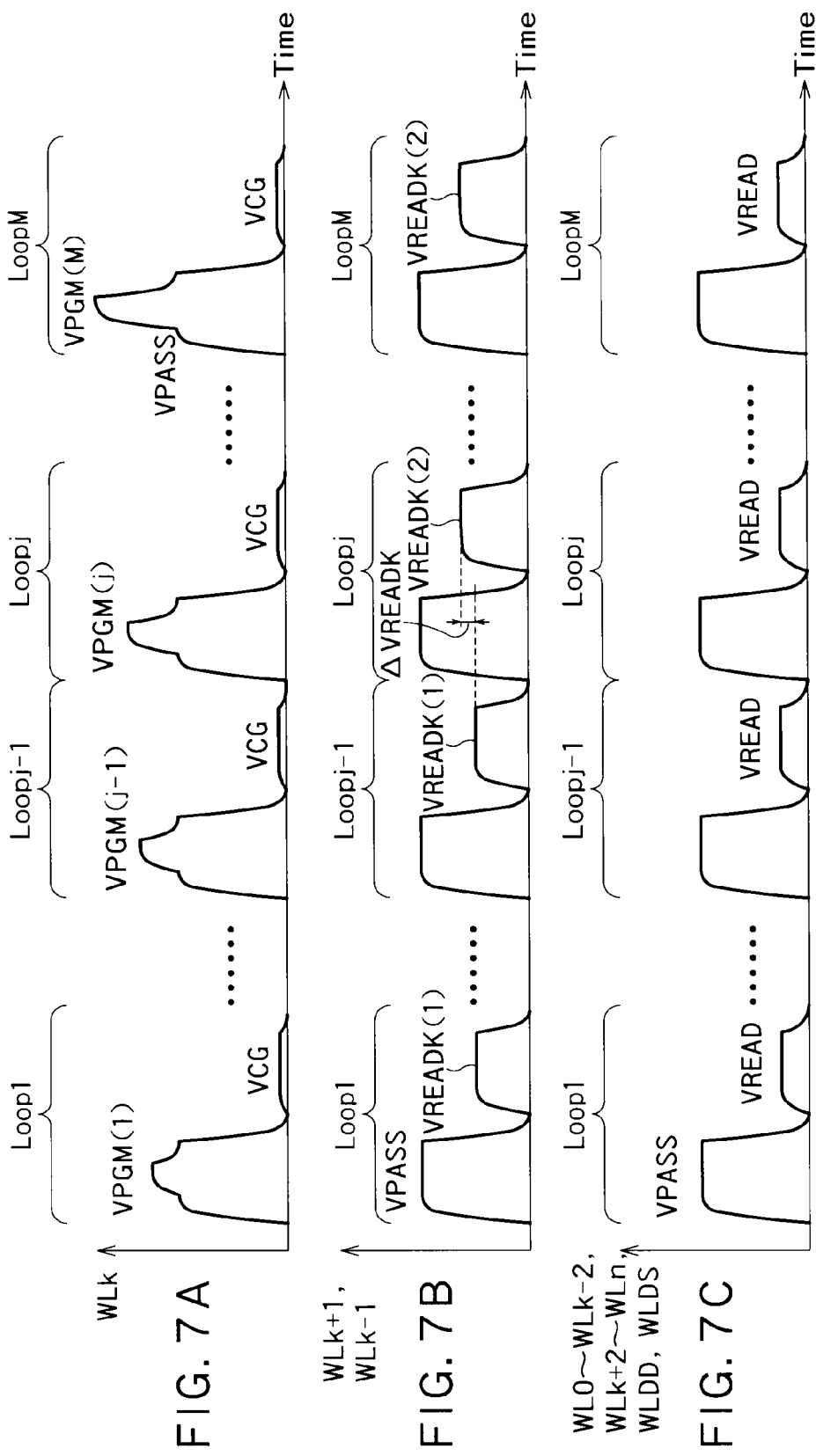
FIGS. 7A to 7C are graphs showing transitions of voltages of word lines in a certain writing stage according to the second embodiment.

FIGS. 7A to 7C are graphs showing transitions of voltages of word lines in a certain writing stage according to the second embodiment.

As shown in FIG. 7A, the verify read voltage VCG of the selected word line WLk is constant in all writing loops Loop1 to LoopM of the writing stage.

As shown in FIG. 7B, verify read voltages of the non-selected word lines WLk−1 and WLk+1 adjacent to the selected word line WLk are changed from VREADK(1) to VREADK(2) in a writing loop Loopj in the middle of the writing stage.

As shown in FIG. 7C, the verify read voltages VREAD of the non-selected word lines WL0 to WLk−2, WLk+2 to WLn, WLDD, and WLDS not adjacent to the selected word line WLk are constant in all writing loops Loop1 to LoopM of the writing stage.

Normally, the non-selected word lines WLk−1 and WLk+1 adjacent to the selected word line WLk among the non-selected word lines have largest influences on the selected memory cell MCk due to the proximity effect. That is, the threshold voltage of the selected memory cell MCk can be controlled to some extent by the voltages of the non-selected word lines WLk−1 and WLk+1. Therefore, the width of the threshold voltage distribution Dp3 shown in FIG. 5C can be effectively narrowed only by changing the verify read voltages of the non-selected word lines WLk−1 and WLk+1. The second embodiment can further achieve other effects in addition to those achieved in the first embodiment. In the second embodiment, power consumption can be reduced as compared to the first embodiment because it suffices that only the verify read voltages of the two non-selected word lines WLk−1 and WLk+1 are raised.

In the second embodiment, only the verify read voltage VREADK of either the non-selected word line WLk+1 or WLk−1 adjacent to the selected word line WLk on one side can be stepped up. Effects of the second embodiment are not lost even in this case.

A voltage difference ΔVREADK between the verify read voltages VREADK(1) and VREADK(2) can be substantially the same level as the voltage difference ΔVREAD in the first embodiment.

Further, the writing loop Loopj in which the verify read voltages of the non-selected word lines WLk−1 and WLk+1 are stepped up is preferably a writing loop before the middle of all the writing loops in considering the tendency of the number of writing loops in the writing stage to decrease with time like in the first embodiment. That is, j is preferably an integer smaller than M/2.

Like in the first embodiment, the number of times the verify read voltages of the non-selected word lines WLk−1 and WLk+1 are stepped up is not limited to any particular one. The word line driver 21 can increase the verify read voltage VREADK in each of the writing loops Loop1 to LoopM. At this time, it suffices that a step-up width of the verify read voltage VREADK in each of the writing loop Loop1 to LoopM is set to ΔVREADK/(M−1).

(Third Embodiment)

Figure 8:
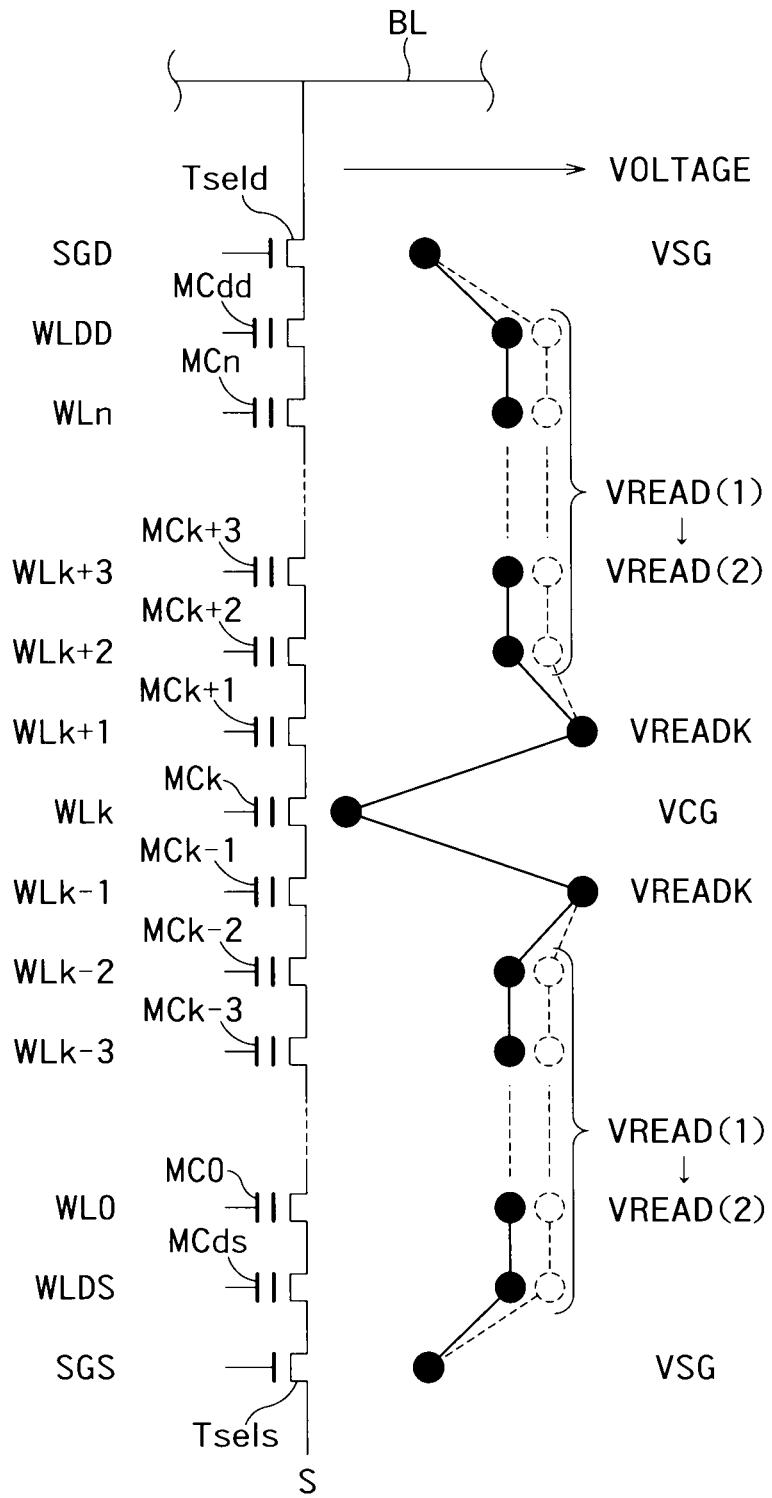
FIG. 8 is a conceptual diagram showing verify read voltages to be applied to word lines WL0 to WLn, WLDS, and WLDD, and gates SGS and SGD of selection transistors Tsels and Tseld in a NAND string NS of a NAND flash memory according to a third embodiment.

FIG. 8 is a conceptual diagram showing verify read voltages to be applied to word lines WL0 to WLn, WLDS, and WLDD, and gates SGS and SGD of selection transistors Tsels and Tseld in a NAND string NS of a NAND flash memory according to a third embodiment of the present invention.

In the second embodiment, the word line driver 21 raises only the verify read voltages VREADK of the non-selected word lines WLk−1 and WLk+1 adjacent to the selected word line WLk on the both sides during the writing stage. The word line driver 21 keeps the verify read voltages VREAD of the non-selected word lines WL0 to WLk−2, WLk+2 to WLn, WLDD, and WLDS other than the non-selected word line WLk−1 and WLk+1 constant. In contrast, in the third embodiment, the word line driver 21 keeps the verify read voltages VREADK of the non-selected word lines WLk−1 and WLk+1 adjacent to the selected word line WLk on the both sides constant. The word line driver 21 raises the verify read voltages VREAD of the non-selected word lines WL0 to WLk−2, WLk+2 to WLn, WLDD, and WLDS other than the non-selected word line WLk−1 and WLk+1 during a writing stage. Other operations in the third embodiment can be the same as corresponding operations in the second embodiment. The configuration of the third embodiment can be identical to that of the second embodiment.

Figure 9A:
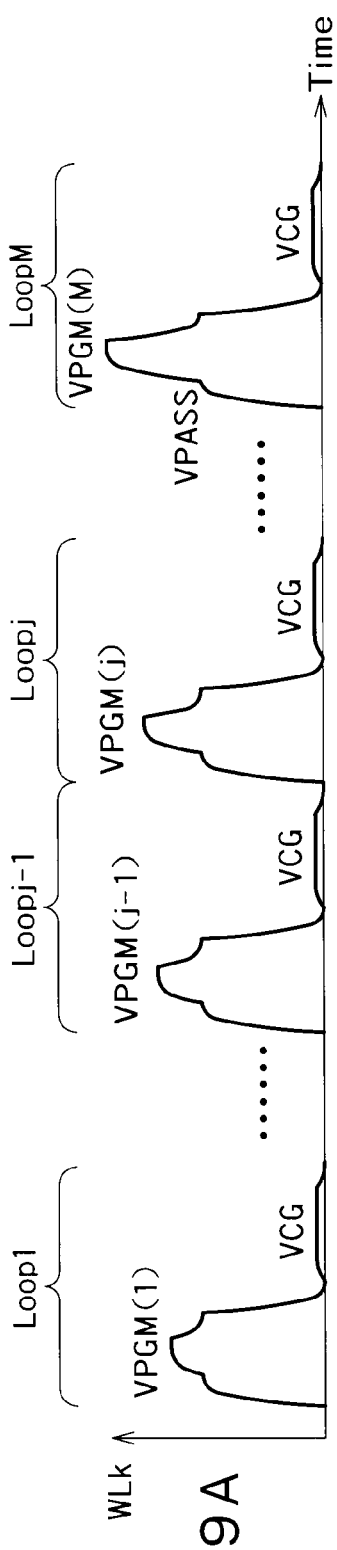
FIGS. 9A to 9C are graphs showing transitions of voltages of the word lines in a certain writing stage according to the third embodiment.
Figure 9B:
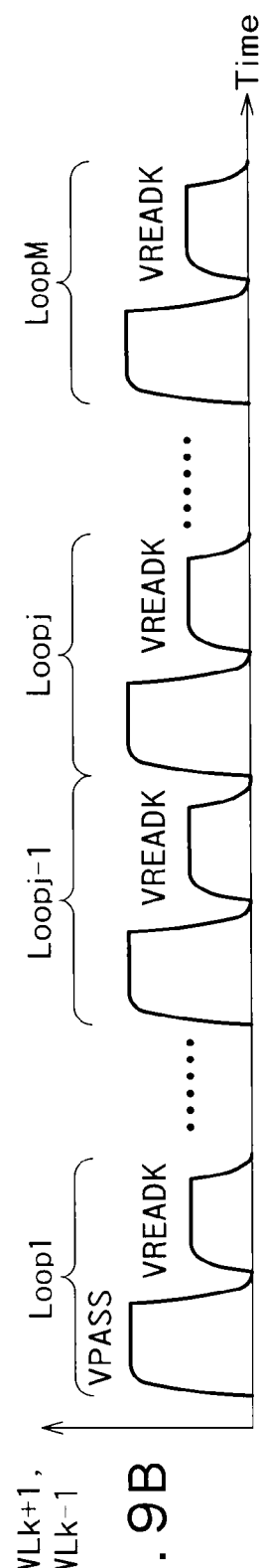
Figure 9C:
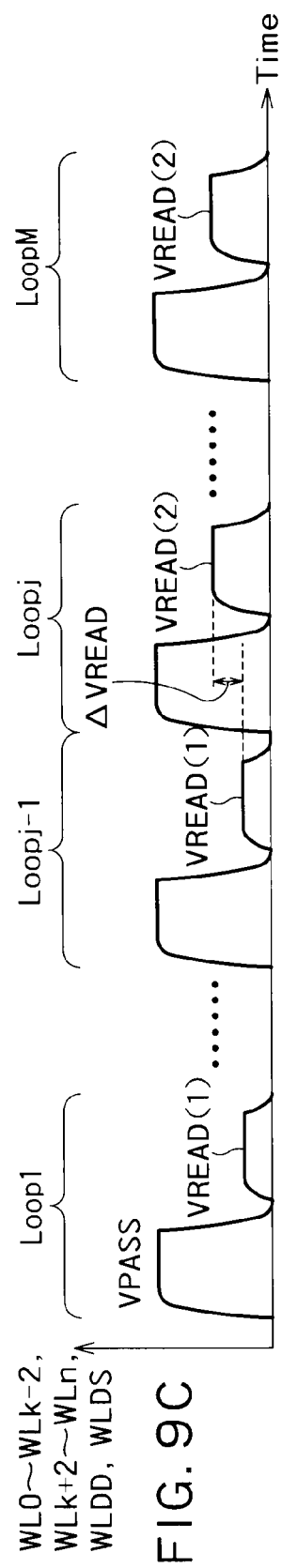

FIGS. 9A to 9C are graphs showing transitions of voltages of the word lines in a certain writing stage according to the third embodiment.

As shown in FIG. 9A, the verify read voltage VCG of the selected word line WLk is constant in all the writing loops Loop1 to LoopM in the writing stage.

As shown in FIG. 9B, the verify read voltages VREADK of the non-selected word lines WLk−1 and WLk+1 adjacent to the selected word line WLk are constant in all the writing loops Loop1 to LoopM in the writing state.

As shown in FIG. 9C, the verify read voltages of the non-selected word lines WL0 to Wlk−2, WLk+2 to WLn, WLDD, and WLDS not adjacent to the selected word line WLk are changed from VREAD(1) to VREAD(2) in a writing loop Loopj during the writing stage.

Although the non-selected word lines WL0 to WLk−2, WLk+2 to WLn, WLDD, and WLDS are not adjacent to the selected word line WLk, the number thereof is quite large. Accordingly, the third embodiment can also achieve effects identical to those of the second embodiment by stepping up the verify read voltages of the non-selected word lines WL0 to WLk−2, WLk+2 to WLn, WLDD, and WLDS from VREAD (1) to VREAD(2). However, power consumption in the third embodiment is increased as compared to that in the second embodiment.

The writing loop Loopj in which the verify read voltage VREAD(1) is stepped up to VREAD(2) is preferably a writing loop before the middle of all the writing loops in considering the tendency of the number of writing loops in the writing stage to decrease with time, like in the first embodiment. That is, j is preferably an integer smaller than M/2.

Like in the first embodiment, the number of times of step-up of the verify read voltage is not limited to any particular one. The word line driver 21 can increase the verify read voltage VREAD in each of the writing loops Loop1 to LoopM. At this time, it suffices that a step-up width of the verify read voltage VREAD in each of the writing loops Loop1 to LoopM is set to ΔVREAD/(M−1).

(Fourth Embodiment)

Figure 10:
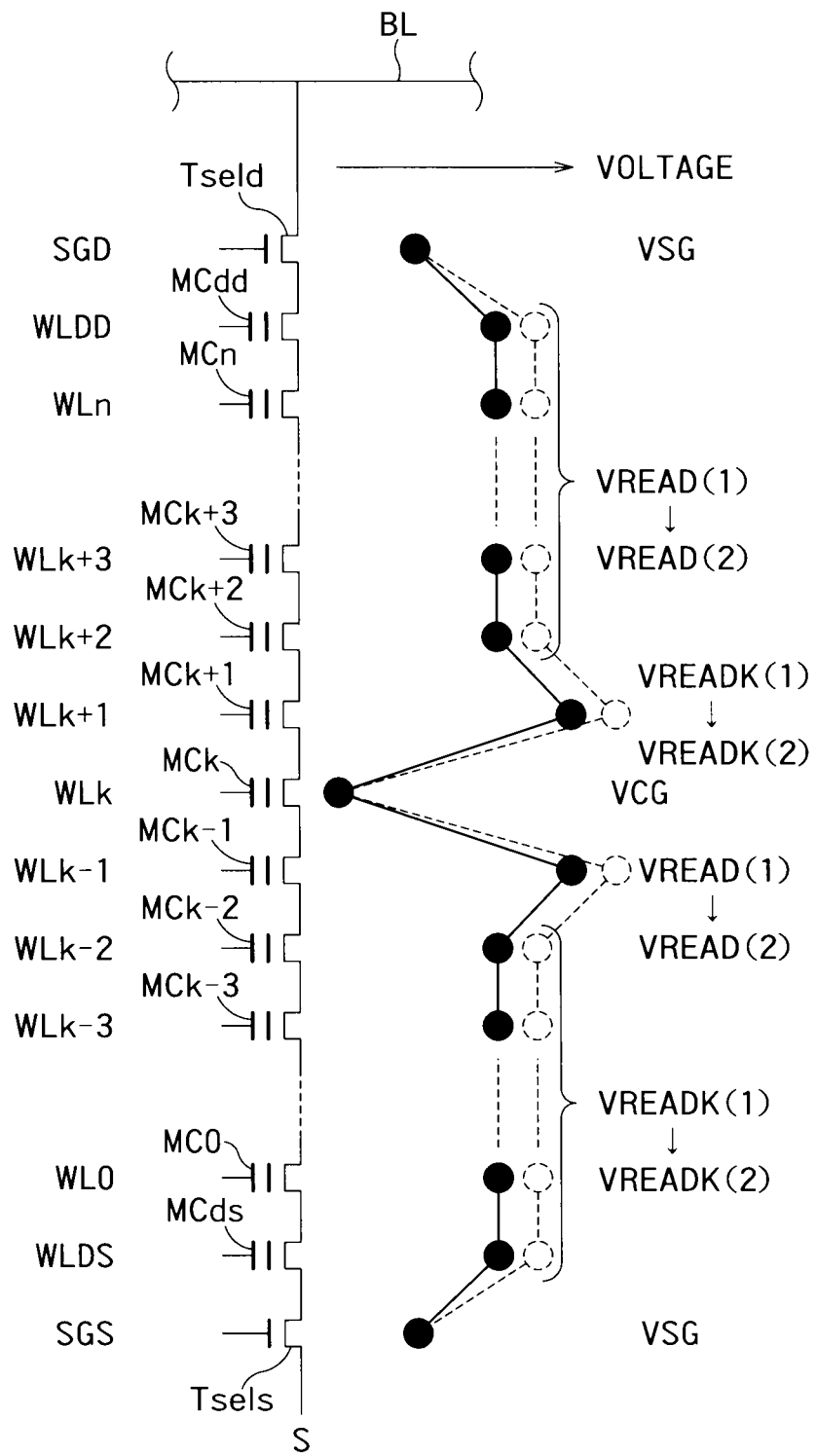
FIG. 10 is a conceptual diagram showing verify read voltages to be applied to word lines WL0 to WLn, WLDS, and WLDD, and gate SGS and SGD of selection transistor Tsels and Tseld in a NAND string NS of a NAND flash memory according to a fourth embodiment.

FIG. 10 is a conceptual diagram showing verify read voltages to be applied to word lines WL0 to WLn, WLDS, and WLDD, and gate SGS and SGD of selection transistor Tsels and Tseld in a NAND string NS of a NAND flash memory according to a fourth embodiment.

The fourth embodiment is obtained by combining the second and third embodiments. That is, in the fourth embodiment, the word line driver 21 raises both of the verify read voltages VREADK of the non-selected word lines WLk−1 and WLk+1 adjacent to the selected word line WLk on the both sides and the verify read voltages VREAD of the non-selected word lines WL0 to WLk−2, WLk+2 to WLn, WLDD, and WLDS during a writing stage.

The configuration of the fourth embodiment can be identical to that of the first embodiment.

Figure 11A:
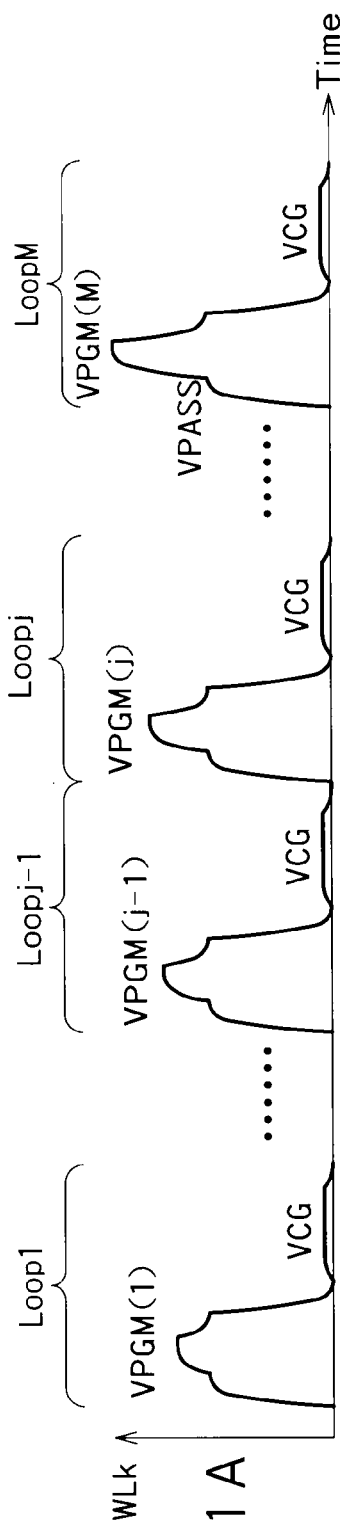
FIGS. 11A to 11C are graphs showing transitions of voltages of the word lines in a writing stage according to the fourth embodiment.
Figure 11B:
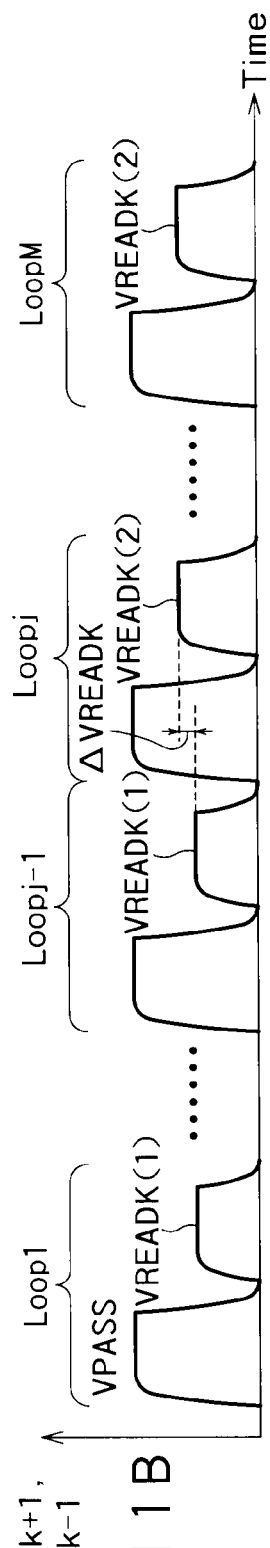
Figure 11C:
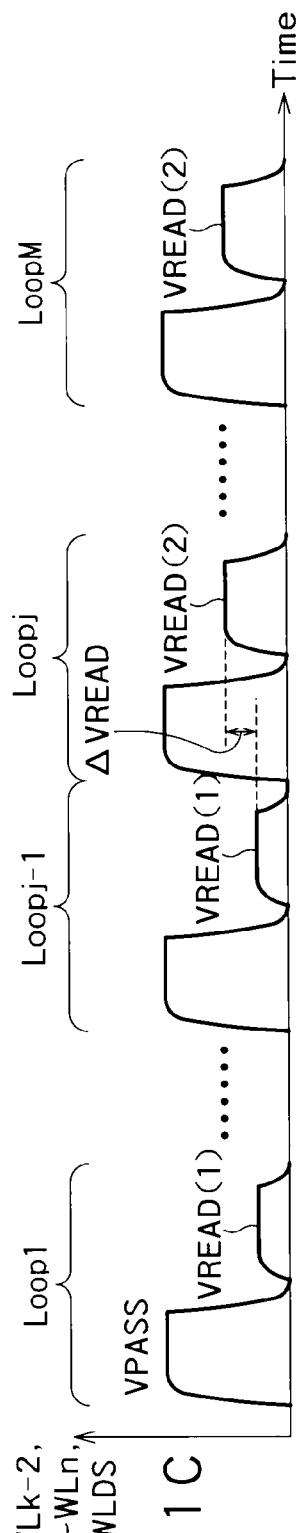

FIGS. 11A to 11C are graphs showing transitions of voltages of the word lines in a writing stage according to the fourth embodiment.

As shown in FIG. 11A, the verify read voltage VCG of the selected word line WLk is constant in all the writing loops Loop1 to LoopM of the writing stage.

As shown in FIG. 11B, the verify read voltages of the non-selected word lines WLk−1 and WLk+1 adjacent to the selected word line WLk are changed from VREADK(1) to VREADK(2) in a writing loop Loopj during the writing stage.

As shown in FIG. 11C, the verify read voltages of the non-selected word lines WL0 to WLk−2, WLk+2 to WLn, WLDD, and WLDS not adjacent to the selected word line WLk are changed from VREAD(1) to VREAD(2) in the writing loop Loopj during the writing stage.

The fourth embodiment can achieve effects identical to those of the first embodiment by stepping up the verify read voltages of the non-selected word lines WL0 to WLn, WLDD, and WLDS in this way.

A voltage difference ΔVREAD between the verify read voltages VREAD(1) and VREAD(2) and a voltage difference ΔVREADK between the verify read voltages VREADK(1) and VREADK(2) can be set to a value equal to or smaller than the voltage difference ΔVREAD in the first embodiment. When the voltage differences ΔVREAD and ΔVREADK are set substantially equal to the voltage difference ΔVREAD in the first embodiment, the effects of the second and third embodiment can be simultaneously obtained. On the other hand, when the voltage differences ΔVREAD and ΔVREADK are set smaller, stress on the memory cells can be reduced and the width of the threshold voltage distribution can be narrowed without damaging reliability in characteristics of the memory cells.

Further, the writing loop Loopj in which the verify read voltages VREAD and VREADK are stepped up is preferably a writing loop before the middle of all the writing loops in considering the tendency of the number of writing loops in the writing stage to decrease with time, like in the first embodiment. That is, j is preferably an integer smaller than M/2.

Like in the first embodiment, the number of times of step-up of the verify read voltages VREAD and VREADK is not limited to any particular one. The word line driver 21 can increase the verify read voltages VREAD and VREADK in each of the writing loops Loop1 to LoopM. At this time, it suffices that step-up widths of the verify read voltages VREAD and VREADK in each of the writing loops Loop1 to LoopM are set to ΔVREAD/(M−1) and ΔVREADK/(M−1), respectively.

(Fifth Embodiment)

FIGS. 12A to 12C are graphs representing a data write operation (a program operation) according to a fifth embodiment of the present invention by transitions of threshold voltage distributions of memory cells. The horizontal axes in the graphs show the threshold voltages of memory cells. The vertical axes in the graphs show the numbers of memory cells. In the fifth embodiment, each of the memory cells MC stores therein 2-bit data. That is, a NAND flash memory according to the fifth embodiment is a multivalued memory.

FIG. 12A shows a distribution De in an erasure state where all memory cells are in an erased state. Two writing stages are required to store 2-bit data in the memory cells MC.

In a first writing stage, the memory writes data "0" in the memory cells MC of the distribution De (data "1") shown in FIG. 12A to form a distribution D0 (data "0") shown in FIG. 12B (Lower Page writing). At this time, it suffices to write the data "0" in the memory cells MC by using one of the first to fourth embodiments. Accordingly, the width of the distribution D0 can be narrowed. In the first writing stage, a verify level is VA1.

In a second writing stage, the memory forms a distribution Da (data "10") in FIG. 12C from the memory cells MC of the distribution De (data "1") in FIG. 12B and forms a distribution Db (data "00") and a distribution Dc (data "01") in FIG. 12C from the memory cells MC of the distribution D0 (data "0") in FIG. 12B (Upper Page writing). Data of the distribution De in FIG. 12C are "11". In the second writing stage, verify levels are VA2, VB2, and VC2.

Figure 13:
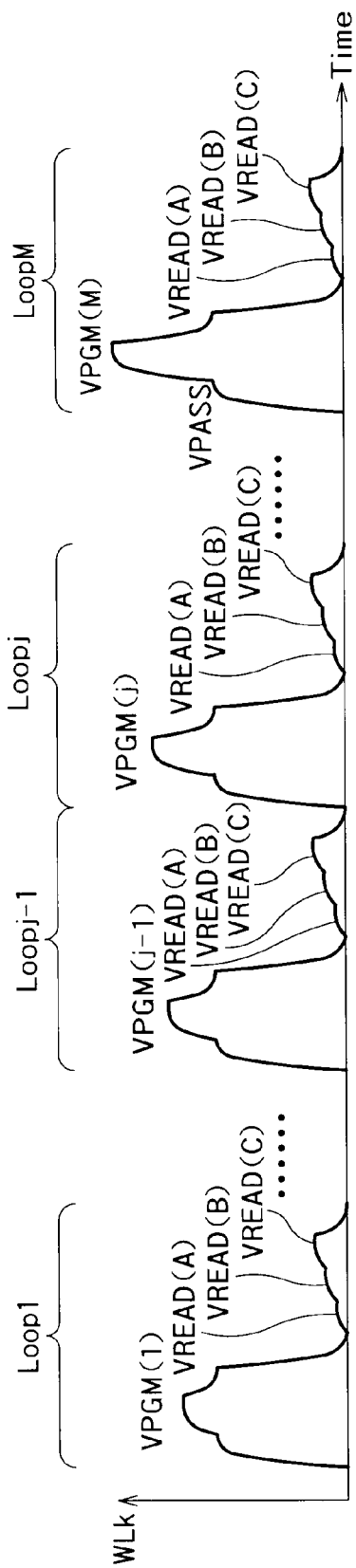
FIG. 13 is a graph showing transitions of voltages of a selected word line in a certain writing stage according to the fifth embodiment.

FIG. 13 is a graph showing transitions of voltages of a selected word line in a certain writing stage according to the fifth embodiment. Because transitions of voltages of the non-selected word lines can be identical to those of voltages of the non-selected word lines in one of the first to fourth embodiments, they are not shown in FIG. 13. The verify read voltage is changed in three steps in each of the writing loops Loop1 to LoopM to write 2-bit data in each of the memory cells MC. A verify read voltage VREAD(A) is a voltage of the selected word line WLk when the distribution Da in FIG. 12(C) is to be read. A verify read voltage VREAD(B) is a voltage of the selected word line WLk when the distribution Db is to be read. A verity read voltage VREAD(C) is a voltage of the selected word line WLk when the distribution Dc is to be read. Therefore, the verify read voltages become larger in the order of VREAD(A), VREAD(B), and VREAD(C).

In each of the writing loops Loop1 to LoopM, a verify read operation is performed for each of the distributions Da, Db, and Dc. Therefore, in the verify read operation, a read operation is performed by using each of the verify read voltages VREAD(A), VREAD(B), and VREAD(C) as shown in FIG. 13.

Because a program voltage VPGM is low in early steps of the writing stage, data with low threshold voltages are written in the memory cells. When writing loops are repeated and then the program voltage VPGM is increased, data with high threshold voltages are written in the memory cells. That is, the write operation is generally performed for the distributions Da, Db, and Dc in this order.

Because the write operation is performed for the distributions Da, Db, and Dc in this order, it can be estimated that data corresponding to the distribution Da are mainly written in the memory cells and data corresponding to the distributions Db and Dc are not written yet in the memory cells in the early steps of the writing stage. Therefore, in the early writing loops of the writing stage, only verify reading using the low verify read voltage VREAD(A) is performed and it is unnecessary to perform verify reading using VREAD(B) and VREAD(C). Accordingly, the verify reading using VREAD(B) and VREAD(C) can be skipped.

Further, it can be estimated that the data of the distribution Dc are written in the memory cells and writing of the data of the distribution Da to the memory cells is completed when repetition of the writing loops has progressed. Therefore, the verify reading using VREAD(B) and VREAD(C) is performed and the verify reading using VREAD(A) can be skipped. When the verify skipping is used in this way, a period of each writing loop can be reduced and accordingly the writing stage can be achieved in a shorter time.

Referring back to FIG. 12C, the threshold voltages of the memory cells belonging to the distribution Dc are highest among the distributions Da to Dc and a voltage to be applied to the non-selected word lines during reading is determined by an upper limit of the distribution Dc. When the width of the distribution Dc is small, a highest value of the threshold voltages becomes low and the voltage to be applied to the non-selected word lines can be set low. Therefore, it is preferable that one of the first to fourth embodiments is applied at least to the writing of the data "01". That is, the word line driver 21 raises the verify read voltage in a stepwise manner during the writing stage of writing the data "01" that causes the threshold voltages of the memory cells to be highest in the 2-bit data. In this way, the width of the distribution Dc can be narrowed and the voltages of the non-selected word lines during reading can be lowered. As a result, the writing speed can be increased.

For example, when the memory writes the distributions Da (data "10"), Db (data "00"), and Dc (data "01") in this order according to the values of the threshold voltages in the second writing stage, it is preferable that one of the first to fourth embodiments is applied during writing of the distribution Dc with the highest threshold voltages.

When the writing is performed in the order of the distributions Da, Db, and Dc, writing of the distribution Da is completed first among the distributions Da to Dc. After completion of the writing, the memory cells of the distribution Da are subject to the proximity effect (also as "intercell interference") from the memory cells to which writing is performed thereafter. Accordingly, the width of the distribution Da becomes easier to increase with respect to those of the other distributions Db and Dc. Therefore, one of the first to fourth embodiments can be also applied during writing of the data "10". This enables to narrow the widths of the both distributions Dc and Da. The difference in threshold voltages between the distributions De and Dc is further reduced by narrowing the widths of the distributions Dc and Da. In this way, the voltages of the non-selected word lines during the reading can be further lowered, and the writing speeds can be increased.

Further, one of the first to fourth embodiments can be applied in writing of all the distributions Da to Dc. This enables to narrow the widths of the distributions Da to Dc. The difference in threshold voltages between the distributions De and Dc is further reduced by narrowing the widths of the distributions Da to Dc. In this way, the non-selected word line voltages during the reading can be further lowered and the writing speeds can be increased.

Of course, when there is a distribution that tends to particularly vary among the distributions Da to Dc, the memory can apply one of the first to the fourth embodiments during writing of data corresponding to the distribution. This enables to efficiently reduce the difference in threshold voltages between the distributions De and Dc. In this way, the non-selected word line voltages during the reading can be further lowered and the writing speeds can be increased.

It is also possible that the word line driver 21 raises the verify read voltage during a stage of writing data to be written last among multiple-bit data. In the example described above, the memory cells MC belonging to the distribution Dc are subject to the writing last. Therefore, it is preferable that one of the first to fourth embodiments is applied during writing of the distribution Dc to be written last based on the writing order of the distributions Da (the data "10"), Db (the data "00"), and Dc (the data "01"). When the width of the distribution Dc to which the writing is performed last is narrowed, an amount of variations in the threshold voltages of the memory cells during the writing can be reduced. When the amount of variations in the threshold voltages of the memory cells is reduced, the proximity effect (intercell interference) of the memory cells belonging to the distribution Dc to which the writing is performed last on the memory cells to which the writing has been already completed is reduced. As a result, expansion of not only the distribution Dc to which the writing is performed last but also of the other distributions Da and Db due to the last writing can be suppressed.

For example, in the second writing stage, when the memory writes the distributions Da (the data "10") and Db (the data "00") in this order after forming the distribution Dc (the data "01"), it is preferable that one of the first to the fourth embodiments is applied during the writing of the distribution Dc with the highest threshold voltages. It is preferable that one of the first to the fourth embodiments is also applied during the writing of the distribution Db to which the writing is performed last.

In the fifth embodiment, the memory writes the 2-bit data in the memory cells MC. However, one of the first to the fourth embodiments can be applied when data of three or more bits are written in each of the memory cells MC.

Figure 14:
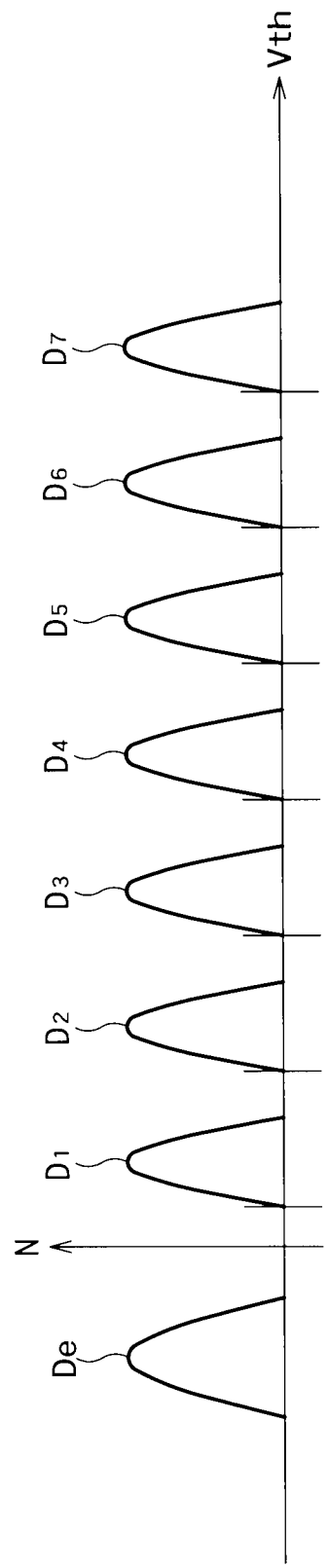
FIG. 14 is a graph showing a threshold voltage distribution obtained when 3-bit data are written in the memory cells MC.

FIG. 14 is a graph showing a threshold voltage distribution obtained when 3-bit data are written in the memory cells MC. The horizontal axis of the graph represents the threshold voltage of memory cell. The vertical axis of the graph represents the number of memory cells.

Like the 2-bit memory, one of the first to fourth embodiments can be also applied to a 3-bit memory. For example, the word line driver 21 raises a verify read voltage in a stepwise manner during a stage of writing data corresponding to a distribution D7 of the memory cells with highest threshold voltages among the 3-bit data. This enables to narrow a width of the distribution D7. A difference in threshold voltages between the distributions De and D7 is reduced by narrowing the width of the distribution D7. Accordingly, voltages of non-selected word lines during reading can be reduced and writing speeds can be increased.

The verify read voltage can be raised in a stepwise manner during a stage of writing data corresponding to two distributions D6 and D7 with highest threshold voltages. This enables to further reduce the difference in threshold voltages between the distributions De and D7 and further lower the word line voltages during the writing or reading.

For example, it is also possible that the word line driver 21 raises the verify read voltage during a stage of writing data to be written last among the 3-bit data. When data corresponding to a distribution Dm ($1 \le m \le 7$) are written last, the verify read voltage is raised in a stepwise manner during a stage of writing the data corresponding to the distribution Dm. This enables to narrow a width of the distribution Dm and reduce the proximity effect (intercell interference) on the memory cells to which writing has been already completed. As a result, widths not only of the distribution Dm but also of distributions other than the distribution Dm can be narrowed.

Also in the 3-bit memory shown in FIG. 14, the verify skip can be utilized in each writing loop. This enables to reduce a period of each writing loop and accordingly achieve the writing stage in a shorter time.

(Modification)

Figure 15:
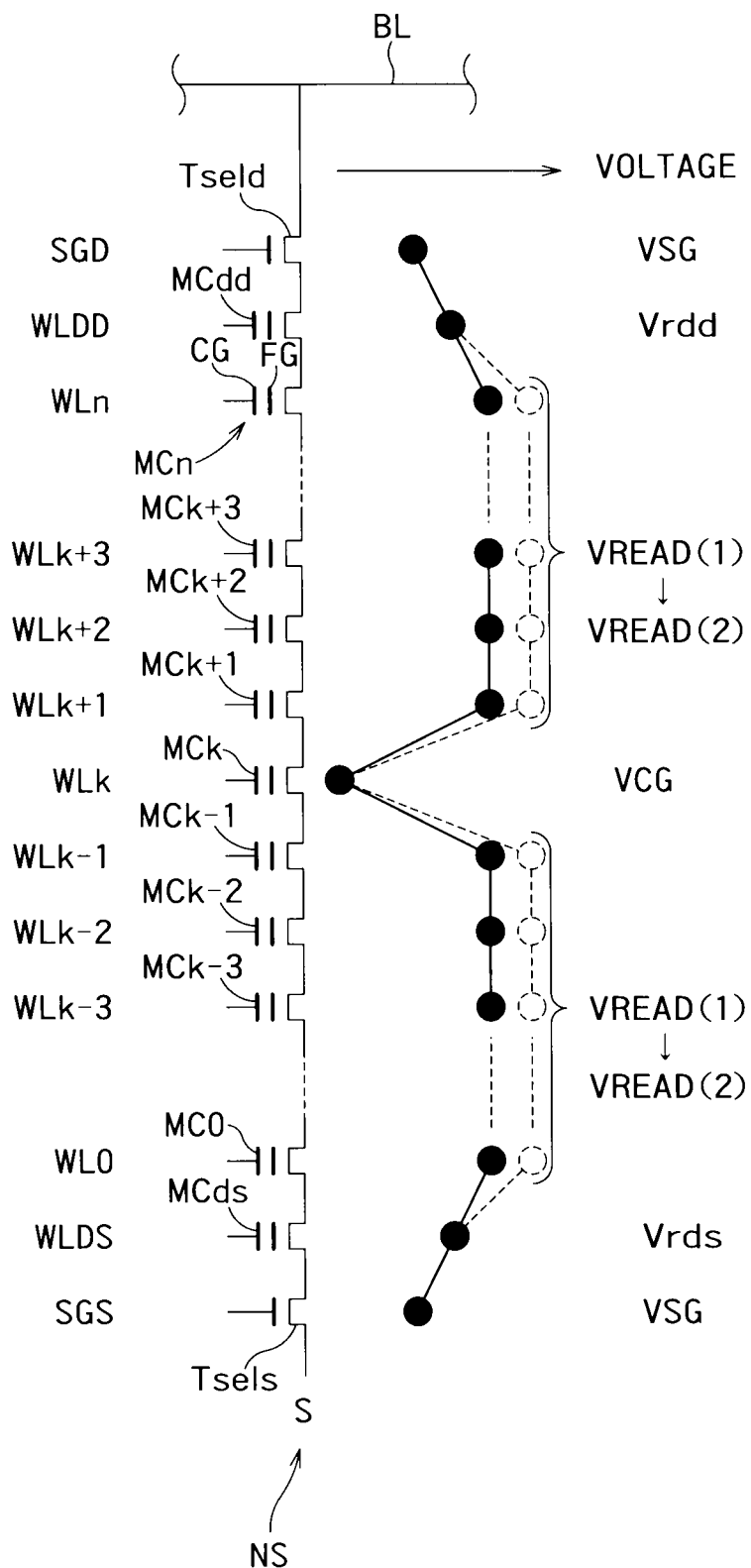
FIG. 15 is a conceptual diagram showing verify read voltages to be applied to word lines WL0 to WLn, WLDS, and WLDD, and gates SGS and SGD of selection transistors Tsels and Tseld in a NAND string NS according to a modification of the first embodiment.

FIG. 15 is a conceptual diagram showing verify read voltages to be applied to word lines WL0 to WLn, WLDS, and WLDD, and gates SGS and SGD of selection transistors Tsels and Tseld in a NAND string NS according to a modification of the first embodiment. In this modification, verify read voltages of memory cells MCds and MCdd adjacent to the selection transistors Tsels and Tseld are fixed to Vrds and Vrdd, respectively. The voltages Vrds and Vrdd are higher than the gate voltage VSG of the selection transistors and lower than the verify read voltage VREAD(1) of other word lines.

The word line driver 21 fixes the verify read voltages of the word lines WLDS and WLDD connected to the non-selected memory cells MCds and MCdd on both ends of the NAND string NS to Vrds and Vrdd, respectively, and raises the verify read voltage VREAD(1) of the word lines WL0 to WLk−1 and WLk+1 to WLn connected to the other non-selected memory cells MC0 to MCk−1 and MCk+1 to MCn. The word lines WLDS and WLDD shown in FIG. 15 and the like are dummy word lines. No writing is performed on the dummy word lines. Accordingly, threshold voltages of the dummy cells MCdd and MCds connected to the dummy word lines can be set low. Therefore, the verify read voltages of the word lines WLDS and WLDD can be fixed to the voltages Vrds and Vrdd lower than VREAD(1) and VREAD(2). This enables to avoid application of excessive stress on the gates of the dummy cells MCds and MCdd.

Other operations of the memory according to this modification are identical to those of the memory according to the first embodiment. Therefore, this modification can also achieve the effects of the first embodiment. The modification can be easily applied to the second to the fifth embodiments.

When the modification is applied to the second to the fifth embodiments, the word line driver 21 applies a highest voltage to the non-selected word lines WLk−1 and WLk+1 adjacent to the selected word line WLk and a lowest voltage to the non-selected word line WLDS and WLDD farthest from the selected word line WLk in the NAND string NS. This enables to avoid application of excessive stress on the gates of the dummy cells MCds and MCdd.

Further, the non-selected memory cells MCk+1 and MC−1 adjacent to the selected memory cell MCk become harder to be brought into conduction due to the proximity effect of the selected word line WLk. However, when a higher voltage is applied to the non-selected word line WLk−1 and WLk+1 adjacent to the selected word line WLk, the non-selected memory cells MCk+1 and MCk−1 can be sufficiently brought into a conduction state. That is, when a higher voltage is applied to the non-selected word lines WLk−1 and WLk+1 adjacent to the selected word line WLk, the threshold voltages of the non-selected memory cells MCk+1 and MCk−1 adjacent to the selected memory cell MCk can be apparently lowered.

(Sixth Embodiment)

Figure 16:
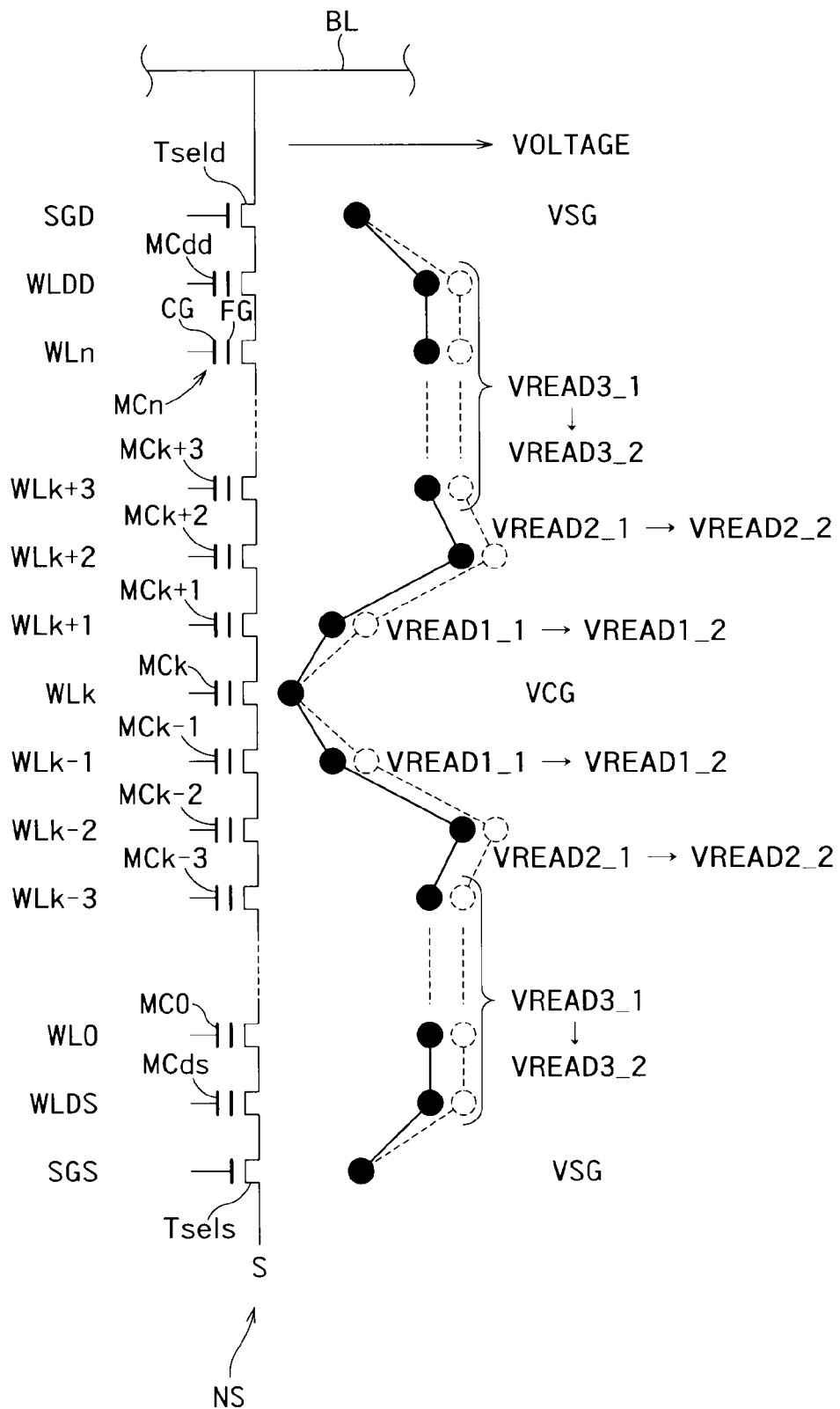
FIG. 16 is a conceptual diagram showing verify read voltages to be applied to word lines WL0 to WLn, WLDS, and WLDD, gates SGS and SGD of selection transistors Tsels and Tseld in a NAND string NS of a NAND flash memory according to a sixth embodiment.

FIG. 16 is a conceptual diagram showing verify read voltages to be applied to word lines WL0 to WLn, WLDS, and WLDD, gates SGS and SGD of selection transistors Tsels and Tseld in a NAND string NS of a NAND flash memory according to a sixth embodiment. Here, n is an integer. As shown in FIG. 16, the NAND string NS as a cell string includes a plurality of memory cells MC connected in series between a bit line BL and a source S. One end of the NAND string NS is connected to the bit line BL via the selection transistor Tseld and the other end thereof is connected to the source S via the selection transistor Tsels.

Each of the memory cells MC includes a source layer, a drain layer, a floating gate FG, and a control gate CG. Two adjacent memory cells MC in the NAND string NS share the source or drain layer. This causes the memory cells MC to be connected in series in the NAND string NS.

In FIG. 16, a word line WLk ($0 \le k \le n$) functions as a selected word line. The word lines WL0 to WLk−1 and WLk+1 to WLn function as non-selected word lines when $1 \le k \le n-1$, the word lines WL1 to WLn function as non-selected word lines when k=0, and the word lines WL0 to WLn−1 function as non-selected word lines when k=n. The word line driver 21 applies the same voltage also to the word lines WLDS and WLDD nearest to the selection transistors Tsels and Tseld as that applied to the other non-selected word lines WL0 to WLk−1 and WLk+1 to WLn. Here, memory cells connected to the word lines WL0 to WLn are denoted by MC0 to MCn, respectively. Memory cells connected to the word lines WLDS and WLDD are denoted by MCds and MCdd, respectively. Here, the word lines WLDS and WLDS are dummy word lines and the cells MCds and MCdd are dummy cells not used for data storage. While the NAND string including the dummy word lines WLDS and WLDD is used as an example in the sixth embodiment, this embodiment can be also applied to a NAND string including no dummy word lines. In this case, effects identical to those of the sixth embodiment can be achieved.

Figure 17A:
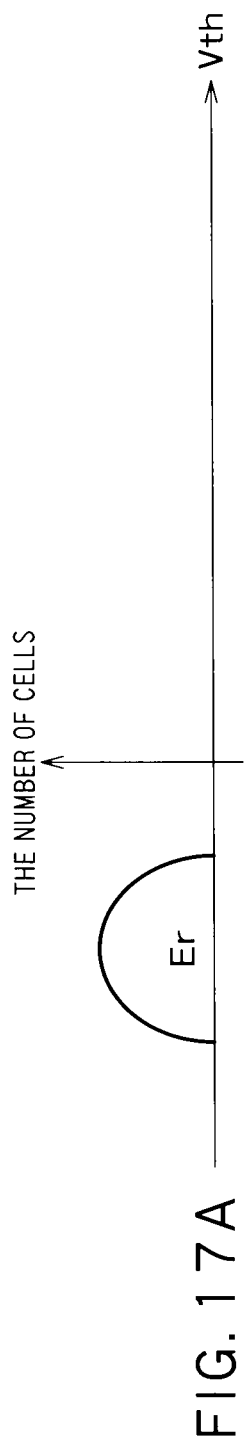
FIGS. 17A to 17C are threshold distribution charts showing a state where 2-bit data is written in each of the memory cells MC in two writing stages.
Figure 17B:
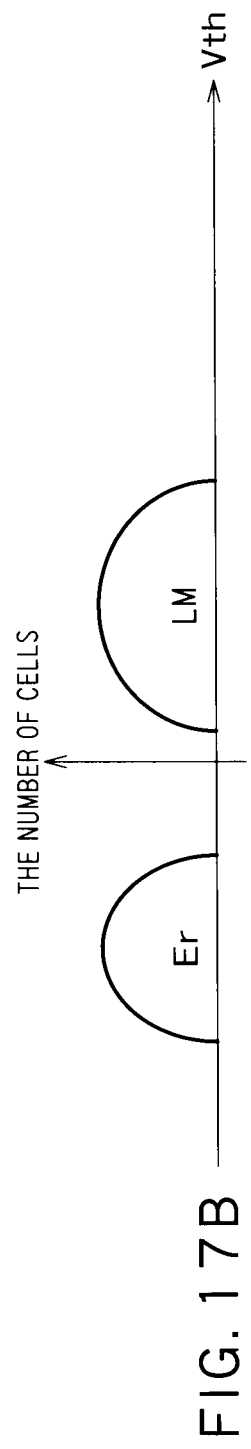
Figure 17C:
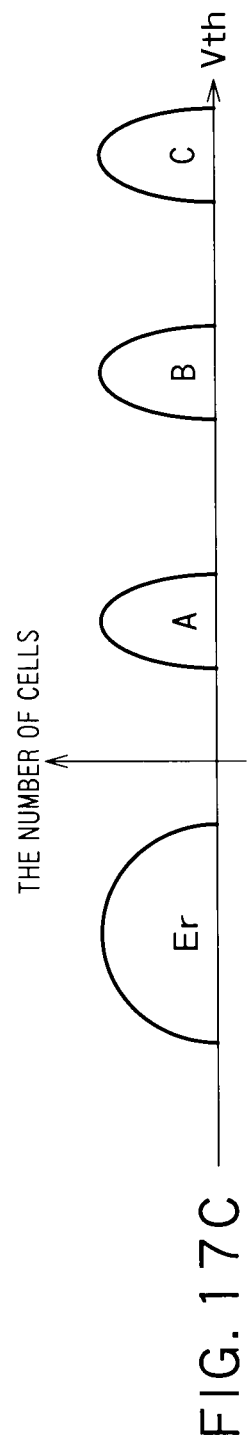

FIGS. 17A to 17C are threshold distribution charts showing a state where 2-bit data is written in each of the memory cells MC in two writing stages. FIG. 17A shows a threshold distribution Er of memory cells in an erased state. FIG. 17B shows threshold distributions Er and LM of memory cells after a first writing stage. FIG. 17C shows threshold distributions Er, A, B, and C of memory cells after a second writing stage. In the second writing stage, the memory cells MC in the distribution LM become the memory cells in the distributions B and C and the memory cells in the distribution Er become the memory cells in the distributions Er and A.

Referring back to FIG. 16, in each writing loop of the first writing stage (FIGS. 17A to 17B), the memory performs a verify read operation after writing data in the memory cells. When the word line WLk is a selected word line, the word line driver 21 applies a gate voltage VCG as a selection voltage to the selected word line WLk in the verify read operation. The word line driver 21 applies a first verify read voltage VREAD1_1 to non-selected word lines WLk−1 and WLk+1 adjacent to the selected word line WLk on both sides. The word line driver 21 further applies a second verify read voltage VREAD2_1 to non-selected word lines WLk−2 and WLk+2 second nearest to the selected word line WLk. The word line driver 21 further applies a third verify read voltage VREAD3_1 to non-selected word lines WL0 to WLk−3, WLk+3 to WLn, WLDS, and WLDD three and more word lines away from the selected word line WLk.

These voltages become larger in the order of VCG, VREAD1_1, VREAD3_1, and VREAD2_1.

The word line driver 21 sets gate voltages of the selection transistors Tsels and Tseld to VSG. The gate voltage VSG is lower than the verify read voltage VREAD3_1 and higher than the voltage VCG, and brings the selection transistors Tsels and Tseld having lower threshold voltages into a conduction state. Accordingly, the non-selected memory cells MC0 to MCk−1, MCk+1 to MCn, MCds, and MCdd are bright into a conduction state and the selection transistors Tsels and Tseld are also brought into a conduction state. As a result, the selected memory cell MCk in a non-conduction state is brought into a state connected between the bit line BL and the source S. A sense amplifier S/A can detect data in the selected memory cell MCk by applying a voltage to the selected memory cell MCk via the bit line BL.

In each writing loop of the second writing stage (FIG. 17B to 17C), the memory performs a verify read operation after writing data in the memory cells. In the verify read operation of the second writing stage, the word line driver 21 changes the voltages VREAD3_1, VREAD2_1, and VREAD1_1 to voltages VREAD3_2, VREAD2_2, and VREAD1_2, respectively. The voltages VREAD3_2, VREAD2_2, and VREAD1_2 are higher than the voltages VREAD3_1, VREAD2_1, and VREAD1_1, respectively. The voltages VREAD3_2, VREAD2_2, and VREAD1_2 can be a certain level higher than the original voltages VREAD3_1, VREAD2_1, and VREAD1_1 or can be a certain ratio higher than the original voltages VREAD3_1, VREAD2_1, and VREAD1_1, respectively.

Voltages shown by solid lines in FIG. 16 are voltages of the respective word lines in the first writing stage and voltages shown by broken lines are voltages of the respective word lines in the second writing stage.

As described above, in the sixth embodiment, the verify read voltages of the non-selected word lines in the second writing stage are higher than those of the non-selected word lines in the first writing stage. The reason why the verify read voltages of the non-selected word lines are different in the first and second writing stages is explained with referring to FIG. 18.

FIG. 18 is a table showing an order in which the first and second writing stages are performed on the memory cells connected to the respective word lines. In this table, "1" to "2n+2" indicate the order of performing the first and the second writing stages. According to this table, after the first writing stage is performed on the word lines WL0 and WL1, the second writing stage is performed on the word line WL0, then the first writing stage is performed on the word line WL2, and the second writing stage is performed on the word line WL1, for example. The writing is continued in this manner. As shown by arrows in FIG. 18, the first writing stage is performed on the word line WLk−1, then the second writing stage is performed on the word line WLk−2, and then the first writing stage is performed on the word line WLk. Here, k denotes an integer from 0 to n. The reason why the first and second writing stages are performed alternately with changing the selected word line is to reduce the proximity effect.

For example, when the word line driver 21 selects the word line WLk to perform the first writing stage, the first writing stage has been already performed on the memory cell MCk−1 connected to the word line WLk−1 adjacent to the word line WLk. Therefore, the memory cell MCk−1 is included in the distribution LM in FIG. 17B in some cases. The first and the second writing stages have not been performed on the memory cells MCk+1 connected to the word line WLk+1 adjacent to the word line WLk. Therefore, the memory cell MCk+1 is in the erased state Er shown in FIG. 17A and the threshold voltage remains low.

When the word line driver 21 selects the word line WLk to perform the second writing stage, the second writing stage has been already performed on the memory cell MCk−1 connected to the word line WLk−1 adjacent to the word line WLk. Therefore, the memory cell MCk−1 is included in the distribution B or C shown in FIG. 17C in some cases. In these cases, the memory cell MCk−1 has a higher threshold voltage than that of the state LM. The first writing stage has been performed on the memory cell MCk+1 connected to the word line WLk+1 adjacent to the word line WLk. Therefore, the memory cell MCk+1 is included in the state LM in FIG. 17B in some cases. In these cases, the memory cell MCk+1 has a higher threshold voltage.

As described above, at the time of performing the first writing stage on the memory cell MCk connected to the word line WLk, the memory cells MCk−1 and MCk+1 adjacent to the memory cell MCK can be included in the distributions LM and Er, respectively. At the time of performing the second writing stage on the memory cell MCk, the memory cells MCk−1 and MCk+1 can be included in the distributions C (or B) and LM, respectively. This means that the threshold voltages of the adjacent memory cells MCk−1 and MCk+1 in the second writing stage are higher than the threshold voltages of the adjacent memory cells MCk−1 and MCk+1 in the first writing stage.

When the threshold voltages of the non-selected memory cells MCk−1 and MCk+1 become higher with the verify read voltage kept constant, a current (a cell current) flowing through the selected memory cell MCk during verify reading of the selected memory cell MCk is reduced. As described above, this is a factor of increasing the width of the threshold voltage distribution (that is, a factor of varying the threshold voltages of the memory cells after writing).

In the sixth embodiment, the verify read voltages VREAD3_1, VREAD2_1, and VREAD1_1 of the non-selected word lines are raised to VREAD3_2, VREAD2_2, and VREAD1_2, respectively, in the second writing stage in which the threshold voltages of the non-selected memory cells MCk−1 and MCk+1 become higher. This sufficiently lowers resistances of the non-selected memory cells MCk−1 and MCk+1 during verify reading for the selected memory cell MCk in the second writing stage, thereby suppressing reduction in the cell current. As a result, the width of the threshold voltage distributions can be narrowed after writing to the memory cells.

In the sixth embodiment, the word line driver 21 raises the verify read voltages of all the non-selected word lines in the second writing stage to facilitate the control of the verify read voltages of the non-selected word lines. In this case, the resistances of the non-selected memory cells MCk−1 and MCk+1 are mainly reduced and resistances of the other non-selected memory cells MC0 to MCk−2 and MCk+2 to MCn are slightly reduced and do not change so much. This is because the resistances of the non-selected memory cells MC0 to MCk−2 and MCk+2 to MCn have been sufficiently reduced by the verify read voltages VREAD3_1 and VREAD2_1.

Therefore, the word line driver 21 can raise only the verify read voltage VREAD1_1 to VREAD1_2 without changing the verify read voltages VREAD3_1 and VREAD2_1 in the second writing stage to reduce the resistances of only the non-selected memory cells MCk−1 and MCk+1. Also in this case, the resistances of the non-selected memory cells MCk−1 and MCk+1 can be reduced and therefore the effects of the sixth embodiment can be achieved.

In the sixth embodiment, the word line driver 21 raises the verify read voltages of the non-selected word lines WLk−1 and WLk+1 in the second writing stage regardless of the state (Er, LM, A, B, or C) of data stored in the non-selected memory cells MCk−1 and MCk+1 adjacent to the selected memory cell MCk. The verify read voltages can be raised regardless of the state of the data stored in the non-selected memory cells to bring the non-selected memory cells MCk−1 and MCk+1 into a sufficiently low resistance state during the verify read operation.

Alternatively, the word line driver 21 can determine whether to raise the verify read voltages of the non-selected word lines WLk−1 and WLk+1 or maintain the verify read voltages without raising in the second writing stage, according to the state of the data stored in the non-selected memory cells MCk−1 and MCk+1 adjacent to the selected memory cell MCk. For example, when the non-selected memory cell MCk−1 or MCk+1 is in the erasure state Er shown in FIG. 17B in the second writing stage for the selected memory cell MCk, the word line driver 21 does not need to raise the verify read voltage of the non-selected memory cell MCk−1 or MCk+1 or the verify read voltages of all the non-selected memory cells in the second writing stage.

Meanwhile, when the non-selected memory cell MCk−1 or MCk+1 belongs to the distribution LM shown in FIG. 17B in the second writing stage for the selected memory cell MCk, the word line driver 21 raises the verify read voltage of the non-selected memory cell MCk−1 or MCk+1 or the verify read voltages of all the non-selected memory cells. The effects of the sixth embodiment are not lost even in this mode.

The word line driver 21 applies the first verify read voltage VREAD1_1 (or VREAD1_2) higher than VCG to the first non-selected memory cells MCk−1 and MCk+1 most adjacent to the selected memory cell MCk during the verify read operation. The word line driver 21 applies the second verify read voltage VREAD2_1 (or VREAD2_2) higher than the first verify read voltage VREAD1_1 (or VREAD1_2) to the second non-selected memory cells MCk−2 and MCk+2 second nearest to the selected memory cell MCk during the verify read operation. The word line driver 21 further applies the third verify read voltage VREAD3_1 (or VREAD3_2) higher than the first verify read voltage VREAD1_1 (or VREAD1_2) and lower than the second verify read voltage VREAD2_1 (or VREAD2_2) to the third non-selected memory cells MCk−3 and MCk+3 third nearest to the selected memory cell MCk during the verify read operation. The reason why the verify read voltages to be applied to the non-selected memory cells MCk−1, MCk+1, MCk−2, and MCk+2 are set closer to VCG when the non-selected memory cells are nearer to the selected memory cell is as follows. With advanced downscaling of the memory, distances between the word lines become smaller and withstand voltages between floating gates of respective memory cells and word lines adjacent to word lines connected to the respective memory cells are reduced. Accordingly, it is necessary to set the verify read voltages closer to VCG when the non-selected memory cells are nearer to the selected memory, thereby reducing potential differences between the floating gates and the adjacent word lines. That is, a gradient of an electric field from VCG to VREAD2_1 (or VREAD2_2) is reduced to avoid concentration of the electric field between the floating gate of the memory cell MCk and the adjacent word lines WLk−1 and WLk+1.

When the word line WL0 is selected, it suffices that the word line driver 21 sets the verify read voltage of the dummy word line WLDS to VREAD1_1 or VREAD1_2. When the word line WLn is selected, it suffices that the word line driver 21 sets the verify read voltage of the dummy word line WLDD to VREAD1_1 or VREAD1_2.

(Seventh Embodiment)

Figure 19:
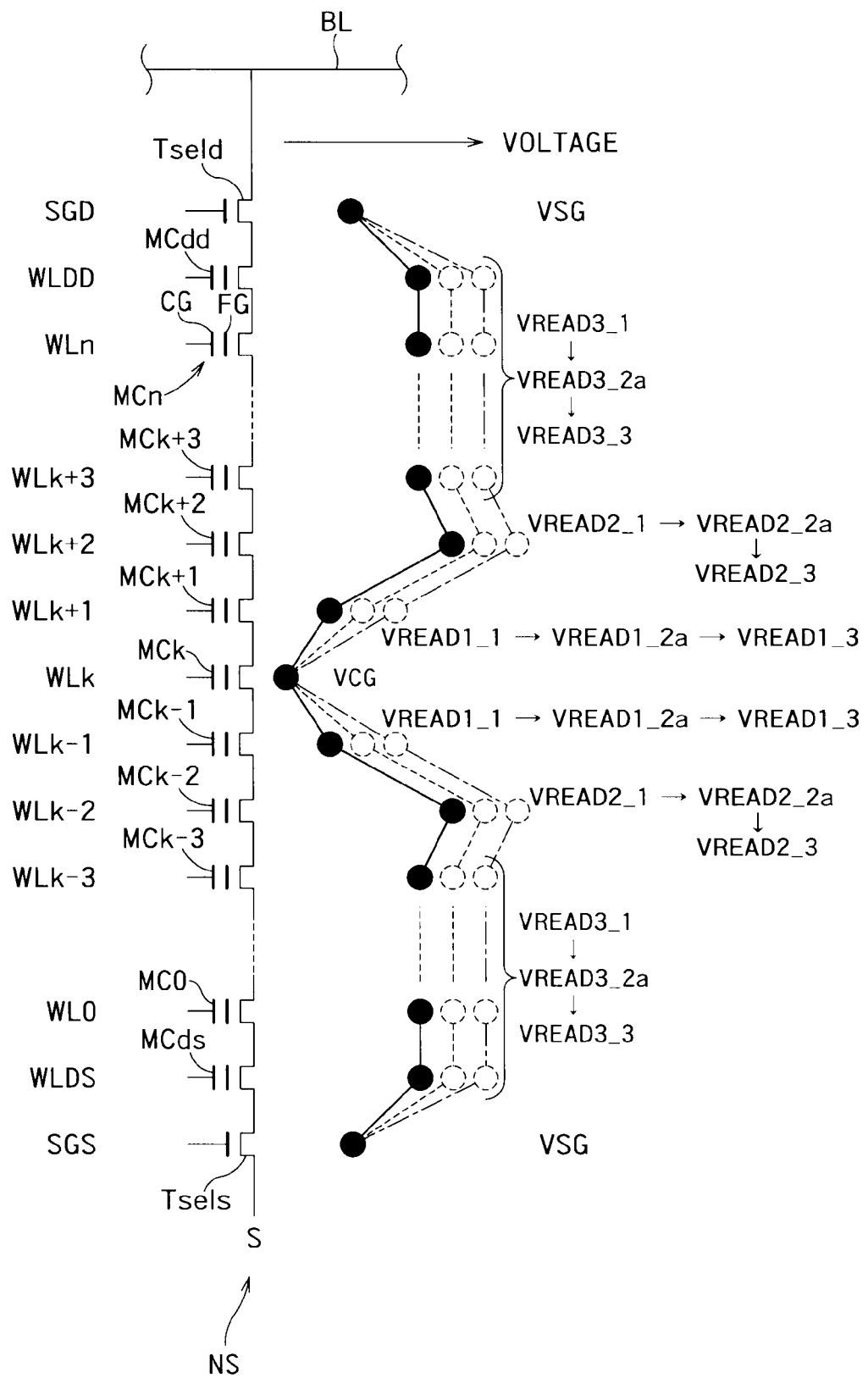
FIG. 19 is a conceptual diagram showing verify read voltages to be applied to word lines WL0 to WLn, WLDS, and WLDD, and gates SGS and SGD of selection transistors Tsels and Tseld in a NAND string NS of a NAND flash memory according to a seventh embodiment.

FIG. 19 is a conceptual diagram showing verify read voltages to be applied to word lines WL0 to WLn, WLDS, and WLDD, and gates SGS and SGD of selection transistors Tsels and Tseld in a NAND string NS of a NAND flash memory according to a seventh embodiment. The configuration of a memory according to the seventh embodiment can be identical to that according to the sixth embodiment. In the seventh embodiment, 2-bit data is written in each of the memory cells MC in three writing stages.

In FIG. 19, a word line WLk (0≤k≤n) functions as a selected word line. The word lines WL0 to WLk−1 and WLk+1 to WLn function as non-selected word lines when 1≤k≤n−1, the word lines WL1 to WLn function as non-selected word lines when k=0, and the word lines WL0 to WLn−1 function as non-selected word lines when k=n. The word line driver 21 applies the same voltage also to the word lines WLDS and WLDD nearest to the selection transistors Tsels and Tseld as that applied to the other non-selected word lines WL0 to WLk−1 and WLk+1 to WLn.

While the NAND string including the dummy word lines WLDS and WLDD is used as an example in the seventh embodiment, this embodiment can be also applied to a NAND string including no dummy word lines. Effects identical to those of the seventh embodiment can be also achieved in this case.

Figure 20A:
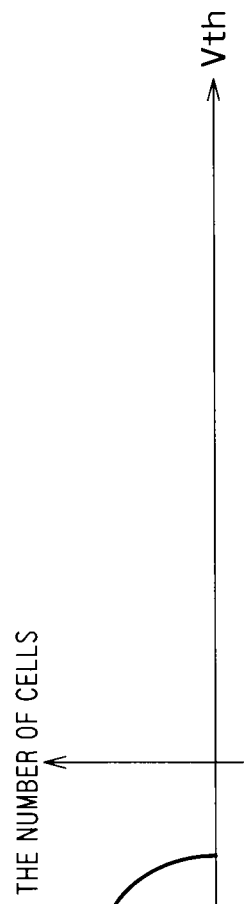
FIGS. 20A to 20D are threshold distribution charts showing a state where 2-bit data is written in each of the memory cells MC according to the seventh embodiment.
Figure 20B:
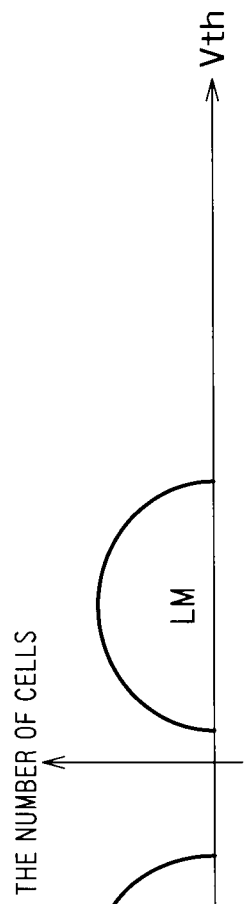
Figure 20C:
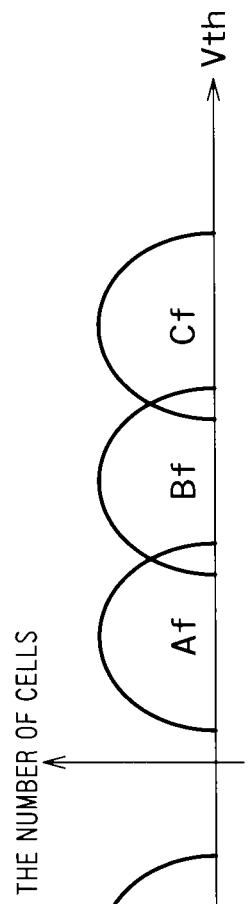
Figure 20D:
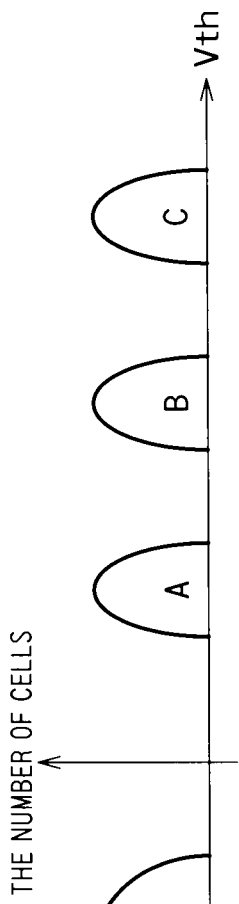

FIGS. 20A to 20D are threshold distribution charts showing a state where 2-bit data is written in each of the memory cells MC according to the seventh embodiment. Reference Er in FIG. 20A denotes a threshold distribution of memory cells in an erased state. Er and LM in FIG. 20B denote threshold distributions of memory cells after a first writing stage. Er, Af, Bf, and Cf in FIG. 20C show threshold distributions of memory cells after a second writing stage. The state of the distributions Af, Bf, and Cf is referred to also as "foggy state". Er, A, B, and C in FIG. 20D denote threshold distributions of memory cells after a third writing stage. The state of the distributions A, B, and C is referred to also as "fine state".

In the second writing stage, the memory cells MC in the distribution LM become the memory cells in the distribution Bf and Cf. The memory cell MC in the distribution Er become the memory cells in the distribution Er and Af. In the third writing stage, the memory cells in the distributions Af, Bf, and Cf become the memory cells in the distribution A, B, and C, respectively.

Referring back to FIG. 19, during a verify read operation of each writing loop of the first writing stage, the word line driver 21 applies the gate voltage VCG as the selection voltage to the selected word line WLk, applies the first verify read voltage VREAD1_1 to the non-selected word lines WLk−1 and WLk+1, applies the second verify read voltage VREAD2_1 to the non-selected word lines WLk−2 and WLk+2, and applies the third verify read voltage VREAD3_1 to the other non-selected word lines WL0 to WLk−3 and WLk+3 to WLn, like in the first writing stage according to the sixth embodiment. Therefore, the distribution LM in FIG. 20B is the same as the distribution LM in FIG. 17B.

Next, in each writing loop of the second writing stage (FIGS. 20B to B20C), the memory performs a verify read operation after writing data in the memory cells. During the verify read operation of the second writing stage, the word line driver 21 changes the voltages VREAD3_1, VREAD2_1, and VREAD1_1 to voltages VREAD3_2a, VREAD2_2a, and VREAD1_2a, respectively. The voltages VREAD3_2a, VREAD2_2a, and VREAD1_2a are higher than the voltages VREAD3_1, VREAD2_1, and VREAD1_1, respectively. The voltages VREAD3_2a, VREAD2_2a, and VREAD1_2a can be a certain level higher than the original voltages VREAD3_1, VREAD2_1, and VREAD1_1 or a certain ratio higher than the original voltages VREAD3_1, VREAD2_1, and VREAD1_1, respectively.

Next, in each writing loop of the third writing stage (FIGS. 20C to 20D), the memory perform a verify read operation after writing data in the memory cells. During the verify read operation of the third writing stage, the word line driver 21 changes the voltages VREAD3_2a, VREAD2_2a, and VREAD1_2a to voltages VREAD3_3, VREAD2_3, and VREAD1_3, respectively. The voltages VREAD3_3, VREAD2_3, and VREAD1_3 are higher than the voltages VREAD3_2a, VREAD2_2a, and VREAD1_2a, respectively. The voltages VREAD3_3, VREAD2_3, and VREAD1_3 can be a certain level higher than the original voltages VREAD3_2a, VREAD2_2a, and VREAD1_2a or a certain ratio higher than the original voltages VREAD3_2a, VREAD2_2a, and VREAD1_2a, respectively.

Voltages shown by solid lines in FIG. 19 are voltages of the respective word lines in the first writing stage, voltages shown by broken lines are voltages of the respective word lines in the second writing stage, and voltages shown by dashed-dotted lines are voltages of the respective word lines in the third writing stage.

As described above, according to the seventh embodiment, the verify read voltages of the non-selected word lines in the second writing stage are higher than the verify read voltages of the non-selected word lines in the first writing stage, and the verify read voltages of the non-selected word lines in the third writing stage are higher than the verify read voltages of the non-selected word lines in the second writing stage.

FIG. 21 is a table showing an order in which the first to third writing stages are performed on the memory cells connected to the respective word lines. In this table, "1" to "3n+3" denotes the order of performing the first to third writing stages. According to this table, the first writing stage is performed on the word lines WL0 and WL1, then the second writing stage is performed on the word line WL0, the first writing stage is performed on the word line WL2, the second writing stage is performed on the word line WL1, and then the third writing stage is performed on the word line WL0, for example. The writing is continued in this manner to perform the first to third writing stages as shown by arrows in FIG. 21. The reason for performing the first to third writing stages in turns with changing the selected word line is to reduce the proximity effect.

When the word line driver 21 selects the word line WLk to perform the first writing stage, for example, the first writing stage has been already performed on the memory cell MCk−1 connected to the word line WLk−1 adjacent to the word line WLk. Therefore, the memory cell MCk−1 is in the distribution LM shown in FIG. 20B in some cases. None of the first to third writing stages have been performed on the memory cell MCk+1 connected to the word line WLk+1 adjacent to the word line WLk. Accordingly, the memory cell MCk+1 is in the erasure state Er shown in FIG. 20A and the threshold voltage remains low.

When the word line driver 21 selects the word line WLk to perform the second writing stage, the second writing stage has been already performed on the memory cell MCk−1. Therefore, the memory cell MCk−1 is in the foggy state of the distribution Bf or Cf shown in FIG. 20C in some cases. In these cases, the threshold voltage of the memory cell MCk−1 is higher than the threshold voltage in the state LM. The first writing stage has been performed on the memory cell MCk+1 connected to the word line WLk+1 adjacent to the word line WLk. Therefore, the memory cell MCk+1 is in the state LM shown in FIG. 20B in some cases. In these cases, the memory cell MCk+1 has a higher threshold voltage.

Further, when the word line driver 21 selects the word line WLk to perform the third writing stage, the third writing stage has been already performed on the memory cell MCk−1. Therefore, the memory cell MCk−1 is in the fine state of the distribution B or C shown in FIG. 20D in some cases. In these cases, the threshold voltage of the memory cell MCk−1 is higher than the threshold voltage of the memory cell MCk−1 in the foggy state. The second writing stage has been already performed on the memory cell MCk+1 connected to the word line WLk+1 adjacent to the word line WLk. Therefore, the memory cell MCk+1 is in the foggy state of the distribution Bf or Cf shown in FIG. 20C in some cases. In these cases, the memory cell MCk+1 has a higher threshold voltage.

As described above, at the time of performing the first writing stage on the memory cell MCk connected to the word line WLk, the memory cells MCk−1 and MCk+1 adjacent to the memory cell MCk can be included in the distributions LM and Er, respectively. At the time of performing the second writing stage on the memory cell MCk, the memory cells MCk−1 and MCk+1 can be included in the distributions Bf or Cf (foggy state) and LM, respectively. This means that the threshold voltages of the adjacent memory cells MCk−1 and MCk+1 in the second writing stage are higher than the threshold voltages of the adjacent memory cells MCk−1 and MCk+1 in the first writing stage.

At the time of performing the third writing stage on the memory cell MCk, the memory cells MCk−1 and MCk+1 can be included in the distribution B or C (fine state) and the distribution Bf or Cf (foggy state), respectively. This means that the threshold voltages of the adjacent memory cells MCk−1 and MCk+1 in the third writing stage are higher than the threshold voltages of the adjacent memory cells MCk−1 and MCk+1 in the second writing stage.

According to the seventh embodiment, in the second writing stage in which the threshold voltages of the non-selected memory cells MCk−1 and MCk+1 become higher, the verify read voltages VREAD3_1, VREAD2_1, and VREAD1_1 of the non-selected word lines are raised to the voltages VREAD3_2a, VREAD2_2a, and VREAD1_2a, respectively. Here, VREAD3_2a>VREAD3_1, VREAD2_2a>VREAD2_1, and VREAD1_2a>VREAD1_1. This sufficiently lowers resistances of the non-selected memory cells MCk−1 and MCk+1 during verify reading for the selected memory cell MCk in the second writing stage, thereby suppressing reduction in the cell current. As a result, widths of the threshold voltage distributions after writing to the memory cells can be narrowed.

Further, according to the seventh embodiment, in the third writing stage in which the threshold voltages of the non-selected memory cells MCk−1 and MCk+1 become higher, the verify read voltages VREAD3_2a, VREAD2_2a, and VREAD1_2a of the non-selected memory cells are raised to VREAD3_3, VREAD2_3, and VREAD1_3, respectively. Here, VREAD3_3>VREAD3_2a, VREAD2_3>VREAD2_2a, and VREAD1_3>VREAD1_2a. This sufficiently lowers the resistances of the non-selected memory cells MCk−1 and MCk+1 during the verify reading for the selected memory cell MCk in the third writing stage, thereby suppressing reduction in the cell current. As a result, the widths of the threshold voltage distributions after writing to the memory cells can be narrowed.

Also in the seventh embodiment, the word line driver 21 can reduce the resistances of only the non-selected memory cells MCk−1 and MCk+1 like in the sixth embodiment. That is, it is possible that the word line driver 21 raises only the verify read voltage VREAD1_1 to VREAD1_2a in the second writing stage and raise only the verify read voltage VREAD1_2a to VREAD1_3 in the third writing stage, without changing the verify read voltages VREAD3_1 and VREAD2_1. Also in this case, the resistances of the non-selected memory cells MCk−1 and MCk+1 can be lowered and the effects of the seventh embodiment can be achieved.

Also in the seventh embodiment, the word line driver 21 can determine whether to raise the verify read voltages of the non-selected word lines WLk−1 and WLk+1 according to the state of data stored in the non-selected memory cells MCk−1 and MCk+1 adjacent to the selected memory cell MCk, like in the sixth embodiment. For example, when the non-selected memory cell MCk−1 or MCk+1 is in the erasure state Er shown in FIG. 20B after the first writing stage, the word line driver 21 does not raise the verify read voltage of the non-selected memory cell MCk−1 or MCk+1 or the verify read voltages of all the non-selected memory cells in the second writing stage. On the other hand, when the non-selected memory cell MCk−1 or MCk+1 belongs to the distribution LM shown in FIG. 20B after the first writing stage, the word line driver 21 raises the verify read voltage of the non-selected memory cell MCk−1 or MCk+1 or the verify read voltages of all the non-selected memory cells in the second writing stage.

Further, when the non-selected memory cell MCk−1 or MCk+1 belongs to the distribution Er shown in FIG. 20C after the second writing stage, the word line driver 21 does not raise the verify read voltage of the non-selected memory cell MCk−1 or MCk+1 or the verify read voltages of all the non-selected memory cells in the third writing stage. When the non-selected memory cell MCk−1 or MCk+1 belongs to the distributions Af to Cf shown in FIG. 20C after the second writing stage, the word line driver 21 raises the verify read voltage of the non-selected memory cell MCk−1 or MCk+1 or the verify read voltages of the all the non-selected memory cells in the third writing stage. The effects of the seventh embodiment are not lost even with this operation.

As described above, the seventh embodiment can be applied even to the method of writing data in each memory cell in the first to third writing stages.

(Eighth Embodiment)

The configuration of the memory according to the eighth embodiment can be identical to that according to the sixth or seventh embodiment. An initial verify read voltage in each writing stage can be the same as VREAD1_1, VREAD2_1 or the like in the sixth or seventh embodiment.

Figure 22A:
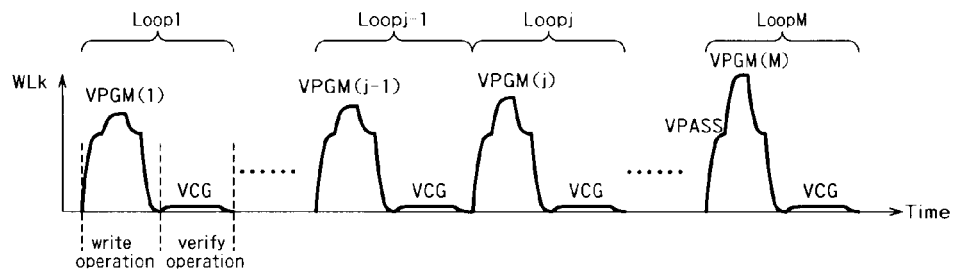
FIGS. 22A to 22D are graphs showing transitions of voltages of the word lines in a first writing stage according to the eighth embodiment.
Figure 22B:
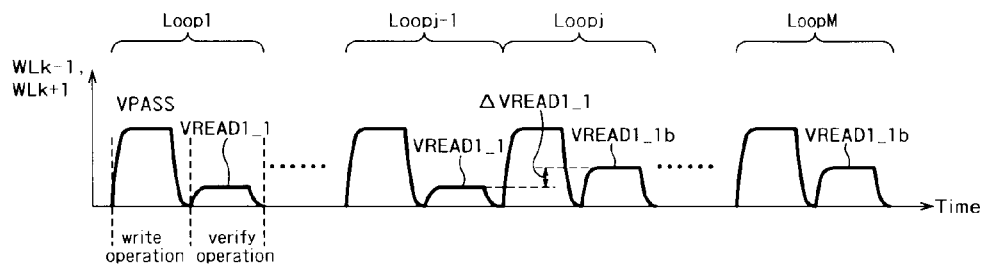
Figure 22C:
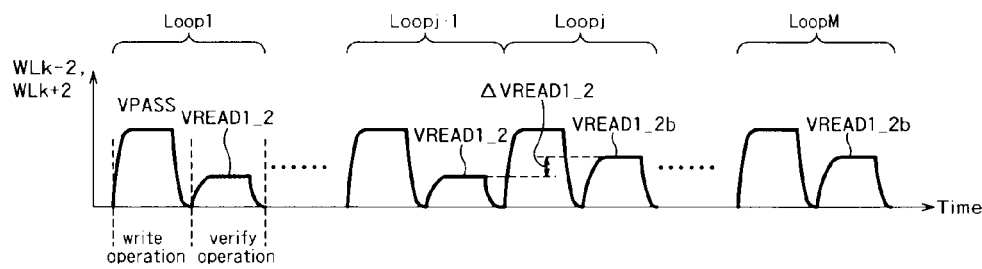
Figure 22D:
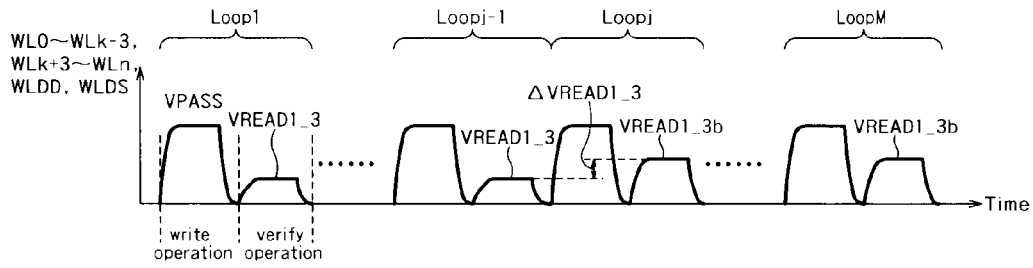

FIGS. 22A to 22D are graphs showing transitions of voltages of the word lines in a first writing stage according to the eighth embodiment. FIG. 22A shows voltages of a selected word line WLk. FIG. 22B shows voltages applied to non-selected word lines WLk−1 and WLk+1 most adjacent to the selected word line WLk. FIG. 22C shows voltages applied to non-selected word lines WLk−2 and WLk+2 second nearest to the selected word line WLk. FIG. 22D shows voltages applied to the other non-selected word lines WL0 to WLk−3, WLk+3 to WLn, WLDD, and WLDS.

An operation for the selected word line WLk shown in FIG. 22A is explained. The word line driver 21 steps up program voltages VPGM(1) to VPGM(M) of the selected word line WLk in writing loops Loop1 to LoopM, respectively, during write operations. With this configuration, the program voltages become higher with an increase in the number of writing loops. That is, even to memory cells that have not passed verification in early writing loops of the writing stage, data (charges) are sufficiently written in the subsequent writing loops due to step-up of the program voltages, which enables the memory cells to pass the verification.

During the verify operation in each of the writing loops Loop1 to LoopM, a voltage applied to the selected word line WLk is VCG and constant. That is, the gate voltage VCG of the selected memory cell MCk during the verify operations is constant in the respective writing loops Loop1 to LoopM.

Meanwhile, voltages of the non-selected word lines WLk−1 and WLk+1 shown in FIG. 22B are VPASS and constant during the write operations in the respective writing loops Loop1 to LoopM. However, during the verify operation in each of the writing loops Loop1 to LoopM, voltages of the non-selected word lines WLk−1 and WLk+1 are VREAD1_1 or VREAD1_1b. Here, VREAD1_1b is higher than VREAD1_1. In earlier writing loops of the writing stage, the word line driver 21 applies the relatively low verify read voltage VREAD1_1 to the non-selected word lines WLk−1 and WLk+1. The word line driver 21 applies the relatively high verify read voltage VREAD1_1b to the non-selected word lines WLk−1 and WLk+1 at a certain point of time in the writing stage.

The reason for changing the verify read voltage to be applied to the non-selected word lines in the middle of the first writing stage is explained below with referring to FIGS. 23A to 23C.

Figure 23A:
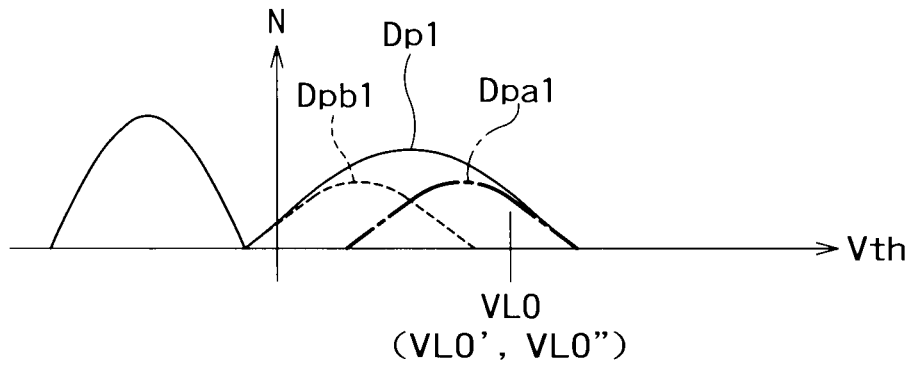
FIGS. 23A to 23C are graphs representing a data write operation according to the eighth embodiment by transitions of threshold voltage distributions of memory cells.
Figure 23B:
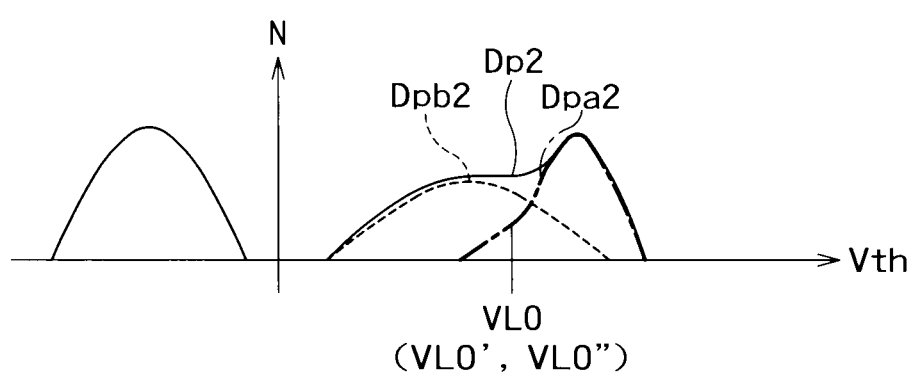
Figure 23C:
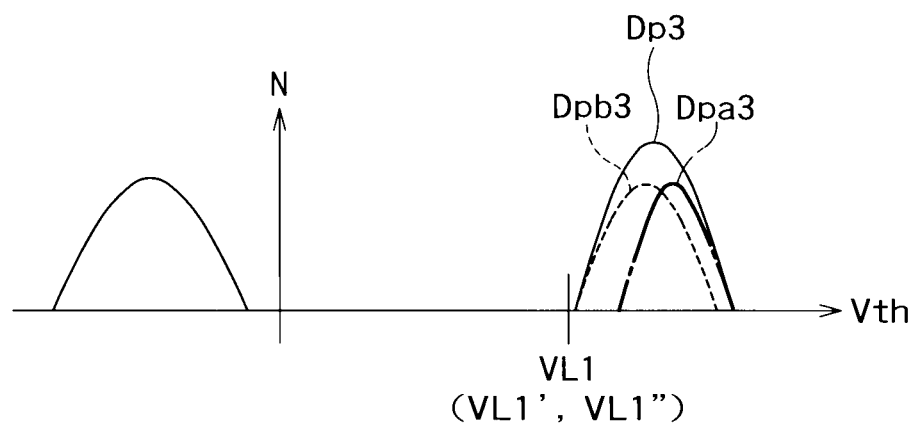

FIGS. 23A to 23C are graphs representing a data write operation (a program operation) according to the eighth embodiment by transitions of threshold voltage distributions of memory cells. Because a threshold voltage distribution in an erasure state is the same as shown in FIG. 2A, explanations thereof will be omitted.

When the verify read voltage is constant in the writing loops like in the conventional technique, the threshold voltages of the writing complete memory cells are gradually increased by the writing loops after completion of the writing and the threshold voltage distribution Dp3 is expanded at the end of the writing stage, as described with referring to FIGS. 2C and 2D.

On the other hand, the memory according to the eighth embodiment uses the lower verify read voltage VREAD1_1 to the non-selected word lines in an early time of the writing stage. While the non-selected memory cells MCk−1 and MCk+1 are brought into a conduction state by application of the verify read voltage VREAD1_1 to the gates, ON resistances thereof are relatively high. Accordingly, a resistance between the bit line BL and the source S become apparently higher. That is, a resistance of the selected memory cell MCk is higher when seen from the sense amplifiers 12. In other words, a verify level VL becomes apparently lower. As a result, the selected memory cell is made easier to pass the verify operation. An apparent verify level at this time is denoted by VL0 in FIG. 23A.

Selected memory cells belonging to distributions Dpai (i=1 to 3) and having higher writing speeds shown in FIGS. 23A to 23C pass verification with a small number of writings. At this time, while some of selected memory cells belonging to a distribution Dpbi and having lower writing speeds also pass the verification with a small number of writing, many of the selected memory cells belonging to the distributions Dpbi do not pass the verification yet as shown in FIG. 23B.

The word line driver 21 raises the verify read voltage to relatively high VREAD1_1b at a certain point of time in the writing stage. This lowers the ON resistances of the non-selected memory cells MCk−1 and MCk+1. Accordingly, the resistance between the bit line BL and the source S becomes apparently lower. That is, the resistance of the selected memory cell MCk is relatively low when seen from the sense amplifiers 12. In other words, the verify level becomes apparently higher. As a result, the selected memory cells become harder to pass the verification operation. An apparent verify level at this time is denoted by VL1 in FIG. 23C.

As shown in FIG. 23B, many of selected memory cells belonging to the distribution Dpa2 and having higher writing speeds have already passed the verification in the writing loop of using the verify read voltage VREAD1_1. These selected memory cells having higher writing speeds have passed the verification with the apparently low verify level VL0. Therefore, the distribution Dpa2 in FIG. 23B is shifted toward a side with low threshold voltages as compared to the distribution Dpa2 shown in FIG. 2C as the comparison example. Writing in the subsequent writing loops to the selected memory cells having once passed the verification is prohibited even when the apparent verify level is changed in this way. Meanwhile, even when the writing is prohibited, the threshold voltages of the selected memory cells to which the writing has been completed are slightly increased by driving of the word line WLk in the subsequent writing loops as described above. That is, because the threshold voltages of the selected memory cells having passed the verification and having higher writing speeds are originally shifted toward the low voltage side in the eighth embodiment, the increase in the threshold voltages after completion of the writing can be substantially cancelled in the selected memory cells having higher writing speeds. It is preferable that a difference between the verify read voltages VL0 and VL1 is substantially the same as a shift amount of the threshold voltages due to the writing loops after the writing completion to cancel the increase in the threshold voltages after the writing completion.

When the verify read voltage is stepped up to VREAD1_1b at a certain point of time in the writing stage, the selected memory cells belonging to the distribution Dpb3 and having lower writing speeds are subject to verification in writing loops of using the verify read voltage VREAD1_1b as shown in FIG. 23C. These selected memory cells having the lower writing speeds pass the verification when exceeding the apparently high verify level VL1. As a result, an overlapped area between the threshold voltage distribution Dpb3 of the selected memory cells having the higher writing speeds and the threshold voltage distribution Dpa3 of the selected memory cells having the lower writing speeds is increased and a width of the entire threshold voltage distribution Dp3 is narrowed.

The above explanations can be similarly applied to the other non-selected word lines WL0 to WLk−2, WLk+2 to WLn, WLDD, and WLDS shown in FIGS. 22C and 22D.

That is, voltages of the non-selected word lines WLk−2 and WLk+2 shown in FIG. 22C are VREAD2_1 or VREAD2_1b during the verify operations in the writing loops Loop1 to LoopM. Here, VREAD2_1b is higher than VREAD2_1. In earlier writing loops of the writing stage, the word line driver 21 applies the relatively low verify read voltage VREAD2_1 to the non-selected word lines WLk−2 and WLk+2. The word line driver 21 applies the relatively high verify read voltage VREAD2_1b to the non-selected word lines WLk−2 and LWk+2 at a certain point of time of the writing stage.

In this manner, the verify read voltages of the non-selected word lines WLk−2 and Wlk+2 are stepped up from VREAD2_1 to VREAD2_1b at the certain point of time in the first writing stage. With this configuration, many of the selected memory cells having higher writing speeds pass verification in writing loops of using the verify read voltage VREAD2_1. These selected memory cells having higher writing speeds pass the verification with an apparently lower verify level VL0'.

On the other hand, the selected memory cells having lower writing speeds are subject to verification in writing loops of using the verify read voltage VREAD2_1b. These selected memory cells having lower writing speeds pass the verification when exceeding an apparently higher verify level VL1'. As a result, an overlapped area between the threshold voltage distribution Dpb3 of the selected memory cells having the lower writing speeds and the threshold voltage distribution Dpa3 of the selected memory cells having the higher writing speeds is increased and the width of the entire threshold voltage distribution Dp3 is narrowed as shown in FIG. 23C.

Voltages of the non-selected word lines WL0 to WLk−3, WLk+3 to WLn, WLDD, and WLDS shown in FIG. 22D are VREAD3_1 or VREAD3_1b in the verify operations of the writing loops Loop1 to LoopM. Here, VREAD3_1b is higher than VREAD3_1. In early writing loops of the writing stage, the word line driver 21 applies the relatively low verify read voltage VREAD3_1 to the non-selected word lines WL0 to WLk−3, WLk+3 to WLn, WLDD, and WLDS. The word line driver 21 applies the relatively high verify read voltage VREAD3_1b to the non-selected word lines WL0 to WLk−3, WLk+3 to WLn, WLDD, and WLDS at a certain point of time in the writing stage.

In this manner, the verify read voltages of the non-selected word lines WL0 to WLk−3, WLk+3 to WLn, WLDD, and WLDS are stepped up from VREAD3_1 to VREAD3_1b at the certain point of time in the first writing stage. Accordingly, many of the selected memory cells having higher writing speeds pass verification in writing loops of using the verify read voltage VREAD3_1. These selected memory cells having higher writing speeds pass the verification with an apparently lower verification level VL0".

On the other hand, the selected memory cells having lower writing speeds are subject to verification in writing loops of using the verify read voltage VREAD3_1b. These selected memory cells having lower writing speeds pass the verification when exceeding an apparently higher verify level VL1". As a result, an overlapped area between the threshold voltage distribution Dpb3 of the selected memory cells having lower writing speeds and the threshold voltage distribution Dpa3 of the selected memory cells having higher writing speeds is increased and the width of the entire threshold voltage distribution Dp3 is narrowed as shown in FIG. 23C.

As described above, the NAND flash memory according to the eighth embodiment sets the verify level in the early writing loops of the writing stage apparently lower and raises the verify level in an intermediate writing loop of the writing stage, thereby narrowing the threshold voltage distribution of the memory cells after writing. When the threshold voltage distribution of the memory cells after the writing is narrowed, the eighth embodiment can suppress increases in writing voltages or reading voltages without changing the correcting capability of the ECC. Therefore, the eighth embodiment can suppress an increase in the chip size.

Voltage differences ΔVREAD1_1 to ΔREAD1_3 depend on distances between gates of adjacent memory cells MC. For example, in the generation in which distances between adjacent gates are about 30 nm, the voltage differences ΔVREAD1_1 to ΔREAD1_3 are preferably between 0.4 and 0.6 V. In the generation in which the distances between adjacent gates are about 25 nm, the voltage differences ΔVREAD1_1 to ΔREAD1_3 are preferably between 0.3 and 0.4 V. In the generation in which the distances between adjacent gates are about 20 nm, the voltage differences ΔVREAD1_1 to ΔREAD1_3 are preferably between 0.2 and 0.3 V. The voltage differences ΔVREAD1_1 to ΔREAD1_3 can be equal to each other.

A writing loop Loopj (1≤j≤M) in which the verify read voltages VREAD1_1 to VREAD3_1 are changed is preferably a writing loop in the middle of all the writing loops. That is, j is preferably an integer around M/2. However, when data writing stages and erasures are repeated to the memory cells, charges to be trapped in a tunnel dielectric film between the floating gates FG and the body areas occur and accordingly the number of writing loops in the writing stages tends to decrease. In considering the charge trap, the writing loop Loopj in which the verify read voltages VREAD1_1 to VREAD3_1 are changed is preferably a writing loop just before the middle of all the writing loops. That is, j is preferably an integer smaller than M/2.

In the eight embodiment, the word line driver 21 steps up the verify read voltages VREAD1_1 to VREAD3_1 only once during the writing stage, respectively. However, the number of respective changes in the verify read voltages VREAD1_1 to VREAD3_1 during each writing stage is not limited to any particular one. The word line driver 21 can increase the verify read voltages VREAD1_1 to VREAD3_1 twice or more times during the writing stage. For example, the word line driver 21 can increase the verify read voltages VREAD1_1 to VREAD3_1 in each of the writing loops Loop1 to LoopM. In this case, while the verify read voltages VREAD1_1 to VREAD3_1 need to be set more finely in many steps, the width of the threshold voltage distribution Dp3 of the selected memory cells can be narrowed more efficiently and variations in the threshold voltages can be suppressed more. Step-up ranges of the verify read voltages VREAD1_1 to VREAD3_1 are preferably equal in the respective writing loops. For example, when the verify read voltage is to increase by ΔVREADL in a certain writing stage, step-up ranges of the verify read voltages VREAD1_1 to VREAD3_1 in the respective writing loops can be set to ΔVREADL(M−1).

While the explanations have been given of the first writing stage, the verify read voltages in the second writing stage can be also raised during the writing stage in a similar manner. That is, according to the eighth embodiment, the verify read voltages of the non-selected word lines are set higher in the second writing stage than those in the first writing stage and the verify read voltages are stepped up during the first and second writing stages.

Figure 24A:
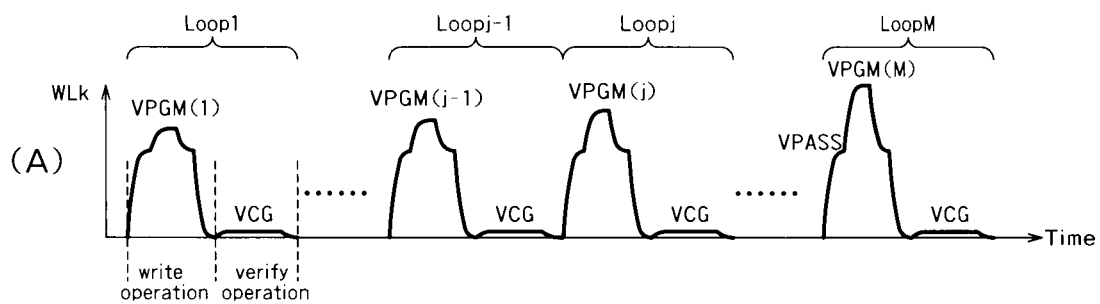
FIGS. 24A to 24D are graphs showing transitions of voltages of word lines in the second writing stage according to the eighth embodiment.

FIGS. 24A to 24D are graphs showing transitions of voltages of word lines in the second writing stage according to the eighth embodiment. Because FIG. 24A is the same as FIG. 22A, explanations thereof will be omitted.

Figure 24B:
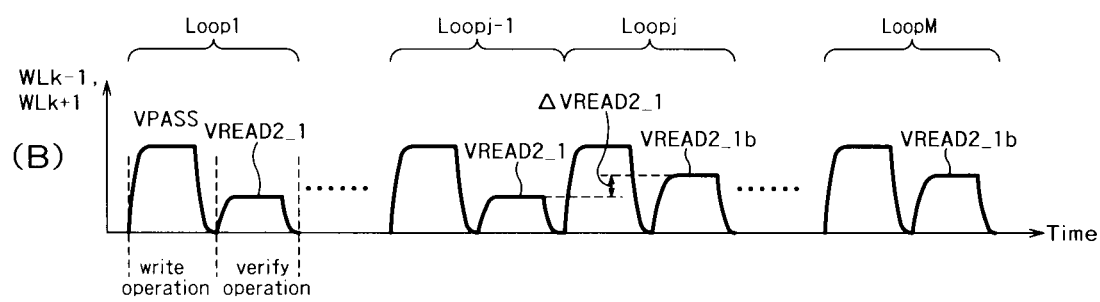

In FIG. 24B, voltages of the non-selected word lines WLk−1 and WLk+1 most adjacent to the selected word line WLk are increased from VREAD2_1 to VREAD2_1b during the second writing stage. VREAD2_1 is higher than VREAD1_1 and VREAD2_1b is higher than VREAD1_1b. Here, ΔVREAD2_1 is a difference between VREAD2_1 and VREAD2_1b.

Figure 24C:
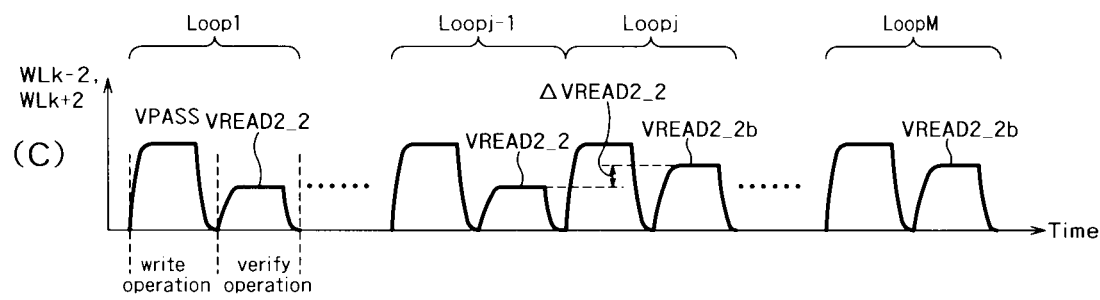

In FIG. 24C, voltages of the non-selected word lines WLk−2 and WLk+2 second nearest to the selected word line WLk are increased from VREAD2_2 to VREAD2_2b during the second writing stage. VREAD2_2 is higher than VREAD1_2 and VREAD2_2b is higher than VREAD1_2b. Here, ΔVREAD2_2 is a difference between VREAD2_2 and VREAD2_2b.

Figure 24D:
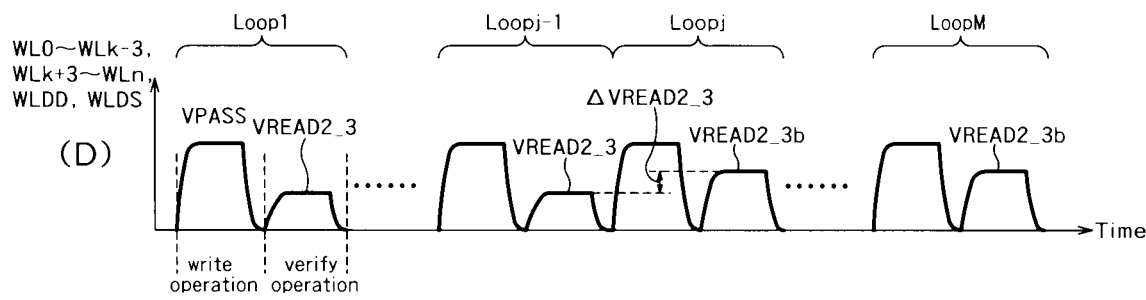

In FIG. 24D, voltages of the other non-selected word lines WL0 to WLk−3, WLk+3 to WLn, WLDD, and WLDS are increased from VREAD2_3 to VREAD2_3b during the second writing stage. VREAD2_3 is higher than VREAD1_3 and VREAD2_3b is higher than VREAD1_3b. Here, ΔVREAD2_3 is a difference between VREAD2_3 and VREAD2_3b.

Accordingly, the eighth embodiment can also achieve the effects of the sixth embodiment and narrow the threshold distribution of the memory cells MC after writing as described above.

The eighth embodiment can be applied not only to the sixth embodiment but also to the seventh embodiment. That is, in the eighth embodiment, data can be written in the memory cells MC by performing the first to third writing stages. In this case, the verify read voltages can be increased also during the third writing stage. Accordingly, the eighth embodiment can also achieve the effects of the seventh embodiment.

Also in the eighth embodiment, the word line driver 21 can reduce the resistances of only the non-selected memory cells MCk−1 and MCk+1. The word line driver 21 can determine whether to raise the verify read voltages of the non-selected word lines WLk−1 and WLk+1 according to the state of the data stored in the non-selected memory cells MCk−1 and MCk+1.

The word line driver 21 can increase the verify read voltages after performing the same number of writing loops in the first to third writing stages. Alternatively, the word line driver 21 can increase the verify read voltages after performing different numbers of writing loops in the first to third writing stages.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a plurality of word lines;
a plurality of bit lines;
a plurality of memory cells respectively having a gate connected to one of the word lines;
a word line driver configured to drive voltages of the word lines; and
a sense amplifier configured to detect data of the memory cells via the bit lines, wherein
the memory cells are connected in series between one of the respective bit lines and a source to constitute a cell string,
the word line driver increases a verification voltage of any of non-selected word lines connected to non-selected memory cells in the cell string at a time of a verify operation in a certain writing loop of a writing stage, to be higher than a previous verification voltage of the non-selected word line at a time of a verify operation in a previous writing loop of the writing stage, the writing stage comprises a plurality of writing loops, and
the writing loops respectively comprises a write operation to write data in a selected memory cell in the cell string and a verify operation to verify that the data are written in the selected memory cell.

2. The device of claim 1, wherein the word line driver increases at least a verification voltage of non-selected word lines connected to non-selected memory cells adjacent to the selected memory cell(s) on either one or both sides of the selected memory cell at a time of a verify operation in a certain writing loop of the writing stage, to be higher than a previous verification voltage of the non-selected word lines at a time of a verify operation in a previous writing loop of the writing stage.

3. The device of claim 1, wherein the word line driver increases verification voltages of non-selected word lines connected to non-selected memory cells adjacent to the selected memory cell on both sides of the selected memory cell at a time of a verify operation in a certain writing loop of the writing stage, to be higher than a previous verification voltage of the non-selected word lines at a time of a verify operation in a previous writing loop of the writing stage.

4. The device of claim 2, wherein the word line driver increases verification voltages of non-selected word lines connected to non-selected memory cells adjacent to the selected memory cell on both sides of the selected memory cell at a time of a verify operation in a certain writing loop of the writing stage, to be higher than a previous verification voltage of the non-selected word lines at a time of a verify operation in a previous writing loop of the writing stage.

5. The device of claim 1, wherein the word line driver increases verification voltages of non-selected word lines connected to non-selected memory cells other than the non-selected memory cell(s) on either one end or both ends of the cell string, to be higher than a previous verification voltage of the non-selected word lines at a time of a verify operation in a previous writing loop of the writing stage.

6. The device of claim 1, wherein the word line driver increases a verification voltage of any of the word lines connected to the non-selected memory cells in a stepwise manner in the respective writing loops.

7. The device of claim 1, wherein
each of the memory cells can store therein multiple bits of data, and
the word line driver increases verification voltages in a stepwise manner at some point of during a period in which data having highest threshold voltages of the memory cells among the multiple bits of data is written.

8. The device of claim 1, wherein
each of the memory cells can store therein multiple bits of data, and
the word line driver increases verification voltages at some point of during a period in which data to be written last among the multiple bits of data are written.

9. The device of claim 7, wherein
each of the memory cells can store therein multiple bits of data, and
the word line driver increases verification voltages at some point of during a period in which data to be written last among the multiple bits of data are written.

10. The device of claim 1, wherein the word line driver applies a highest voltage to non-selected word lines connected to the non-selected memory cells adjacent to the selected memory cell in the cell string and applies a lowest voltage to non-selected word lines connected to the non-selected memory cells farthest from the selected memory cell in the cell string.

11. A semiconductor memory device comprising:
a plurality of word lines;
a plurality of bit lines;
a plurality of memory cells respectively having a gate connected to one of the word lines;
a word line driver configured to drive voltages of the word lines; and
a sense amplifier configured to detect data of the memory cells via the bit lines, wherein
the memory cells are connected in series between one of the respective bit lines and a source to constitute a cell string,
multiple bits of data is stored in a selected memory cell by performing a first writing stage and a second writing stage, the first writing stage brings the selected memory cell into a first state by repeating a writing loop comprising a write operation and a verify read operation, the write operation is an operation in which data is written in the selected memory cell in the cell string, the verify read operation is an operation in which it is verified that the data is written in the selected memory cell, the second writing stage brings the selected memory cell from the first state into a second state by repeating the writing loop, and
the word line driver increases a verification voltage of any of non-selected word lines connected to non-selected memory cells in the cell string during the verify read operation when the second writing stage is performed on the selected memory cell, the increased verification voltage is greater than the verification voltage when the first writing stage is performed on the selected memory cell.

12. The device of claim 11, wherein, during the verify read operation, the word line driver applies a selected voltage to the selected memory cell, applies a first verification voltage higher than the selected voltage to a first non-selected memory cell which is the nearest non-selected memory cell to the selected memory cell, applies a second verification voltage higher than the first verification voltage to a second non-selected memory cell which is the second nearest non-selected memory cell to the selected memory cell, and applies a third verification voltage higher than the second verification voltage to a third non-selected memory cell which is the third nearest non-selected memory cell to the selected memory cell.

13. The device of claim 11, wherein multiple bits of data is stored in a selected memory cell by performing a third writing stage after the first and the second writing stages, the third writing stage brings the selected memory cell from the second state into a third state by repeating the writing loop,
the word line driver increases a verification voltage of any of non-selected word lines connected to non-selected memory cells in the cell string during the verify read operation when the third writing stage is performed on the selected memory cell, the increased verification voltage is greater than the verification voltage when the second writing stage is performed on the selected memory cell.

14. The device of claim 11, wherein the word line driver increases a verification voltage of any of non-selected word lines connected to non-selected memory cells in the cell string at a time of the verify read operation in any of the writing loops of the first or the second writing stage.

15. The device of claim 11, wherein the word line driver increases verification voltages applied to all of the non-selected memory cells in the cell string when the second writing stage is performed on the selected memory cell, the increased verification voltage is greater than the verification voltage when the first writing stage is performed on the selected memory cell.

16. The device of claim 14, wherein the word line driver increases verification voltages applied to all of the non-selected memory cells in the cell string when the third writing stage is performed on the selected memory cell, the increased verification voltage is greater than the verification voltage when the second writing stage is performed on the selected memory cell.

17. The device of claim 12, wherein the word line driver increases the first verification voltage when the second writing stage is performed on the selected memory cell, the increased first verification voltage is greater than the first verification voltage when the first writing stage is performed on the selected memory cell, the word line driver does not change the second and the third verification voltages.

18. The device of claim 13, wherein the word line driver increases the first verification voltage when the third writing stage is performed on the selected memory cell, the increased first verification voltage is greater than the first verification voltage when the second writing stage is performed on the selected memory cell, the word line driver does not change the second and the third verification voltages.

19. The device of claim 14, wherein the word line driver increases the first verification voltage when the third writing stage is performed on the selected memory cell, the increased first verification voltage is greater than the first verification voltage when the second writing stage is performed on the selected memory cell, the word line driver does not change the second and the third verification voltages.

20. The device of claim 11, wherein the semiconductor memory device is NAND type flash memory.

\* \* \* \* \*